(12) United States Patent
Adams et al.

(10) Patent No.: US 9,972,565 B1
(45) Date of Patent: May 15, 2018

(54) LATERAL VIAS FOR CONNECTIONS TO BURIED MICROCONDUCTORS

(71) Applicant: National Technology & Engineering Solutions of Sandia, LLC, Albuquerque, NM (US)

(72) Inventors: David P. Adams, Albuquerque, NM (US); Kira L. Fishgrab, Albuquerque, NM (US); Karl Douglas Greth, Albuquerque, NM (US); Michael David Henry, Albuquerque, NM (US); Jeffrey Stevens, Albuquerque, NM (US); V. Carter Hodges, Albuquerque, NM (US); Randy J. Shul, Albuquerque, NM (US); Ronald S. Goeke, Albuquerque, NM (US); Robert K. Grubbs, Boise, ID (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days. days.

(21) Appl. No.: 15/175,312

(22) Filed: Jun. 7, 2016

(51) Int. Cl.
| | |
|---|---|
| *H01L 23/538* | (2006.01) |
| *H01L 23/498* | (2006.01) |
| *H01L 23/31* | (2006.01) |
| *H01L 21/48* | (2006.01) |
| *H01L 23/00* | (2006.01) |

(52) U.S. Cl.
CPC .... *H01L 23/49827* (2013.01); *H01L 21/4803* (2013.01); *H01L 21/486* (2013.01); *H01L 21/4853* (2013.01); *H01L 23/3178* (2013.01); *H01L 23/49811* (2013.01); *H01L 23/49838* (2013.01); *H01L 23/5384* (2013.01); *H01L 23/5386* (2013.01); *H01L 24/16* (2013.01); *H01L 24/25* (2013.01); *H01L 2224/165* (2013.01); *H01L 2224/16112* (2013.01); *H01L 2224/25105* (2013.01)

(58) Field of Classification Search
CPC ............. H01L 21/76898; H01L 23/481; H01L 23/49811; H01L 23/49827; H01L 23/49838; H01L 23/5384; H01L 23/5386; H01L 24/25; H01L 24/81; H01L 2224/251; H01L 2224/25105
See application file for complete search history.

(56) References Cited

U.S. PATENT DOCUMENTS

| | | |
|---|---|---|
| 4,948,941 A | 8/1990 | Altman et al. |
| 5,624,529 A | 4/1997 | Shul et al. |
| 5,814,238 A | 9/1998 | Ashby et al. |

(Continued)

OTHER PUBLICATIONS

U.S. Appl. No. 14/069,487, filed Nov. 1, 2013, Dirk et al.
(Continued)

*Primary Examiner* — Stephen W Smoot
(74) *Attorney, Agent, or Firm* — Helen S. Baca

(57) ABSTRACT

The present invention relates to a lateral via to provide an electrical connection to a buried conductor. In one instance, the buried conductor is a through via that extends along a first dimension, and the lateral via extends along a second dimension that is generally orthogonal to the first dimension. In another instance, the second dimension is oblique to the first dimension. Components having such lateral vias, as well as methods for creating such lateral vias are described herein.

18 Claims, 13 Drawing Sheets

(56) References Cited

U.S. PATENT DOCUMENTS

| | | | |
|---|---|---|---|
| 5,866,925 | A | 2/1999 | Zolper et al. |
| 6,432,577 | B1 | 8/2002 | Shul et al. |
| 6,472,332 | B1 | 10/2002 | Gooray et al. |
| 6,578,254 | B2 | 6/2003 | Adams et al. |
| 6,657,159 | B2 | 12/2003 | McKee et al. |
| 6,660,648 | B1 | 12/2003 | Galambos et al. |
| 6,820,469 | B1 | 11/2004 | Adkins et al. |
| 6,823,720 | B1 | 11/2004 | Adkins et al. |
| 6,903,013 | B2 | 6/2005 | Chan et al. |
| 6,930,051 | B1 | 8/2005 | Manginell et al. |
| 6,939,579 | B2 | 9/2005 | Bondestam et al. |
| 7,051,656 | B1 | 5/2006 | Koehler et al. |
| 7,105,098 | B1 | 9/2006 | Shul et al. |
| 7,112,544 | B2 | 9/2006 | Doan et al. |
| 7,148,436 | B1 | 12/2006 | Lee et al. |
| 7,383,774 | B1 | 6/2008 | Koehler et al. |
| 7,449,699 | B1 | 11/2008 | Adams et al. |
| 8,080,280 | B1 | 12/2011 | Grubbs et al. |
| 8,236,611 | B1 | 8/2012 | Anderson et al. |
| 8,597,985 | B1 | 12/2013 | Chanchani et al. |
| 8,685,599 | B1 | 4/2014 | Adams et al. |
| 9,116,249 | B1 | 8/2015 | Claus et al. |
| 9,203,134 | B1 | 12/2015 | Henry et al. |
| 9,385,140 | B1 * | 7/2016 | McMullan .......... H01L 27/1203 |
| 2005/0064732 | A1 * | 3/2005 | Muench ................ H01L 23/057 |
| | | | 439/55 |
| 2008/0079163 | A1 * | 4/2008 | Kurita ................ H01L 21/6835 |
| | | | 257/759 |

OTHER PUBLICATIONS

U.S. Appl. No. 14/081,342, filed Nov. 15, 2013, Coleman et al.
U.S. Appl. No. 14/632,838, filed Feb. 26, 2015, Hall et al.
U.S. Appl. No. 14/739,956, filed Jun. 15, 2015, Adams et al.
U.S. Appl. No. 14/742,505, filed Jun. 17, 2015, Henry et al.
U.S. Appl. No. 14/819,293, filed Aug. 5, 2015, Zortman et al.
U.S. Appl. No. 14/836,713, filed Aug. 26, 2015, Beutler et al.
U.S. Appl. No. 14/923,031, filed Oct. 26, 2015, Kammler et al.
Aaltonen T et al., "Atomic layer deposition of platinum thin films," *Chem. Mater.* 2003;15(9):1924-8.
Adams DP, "Reactive multilayers fabricated by vapor deposition: a critical review," *Thin Solid Films* 2015;576:98-128.
Adomaitis Ra, "A ballistic transport and surface reaction model for simulating atomic layer deposition processes in high-aspect-ratio nanopores," (29 pp., published in *Chem. Vapor Deposition* 2011;17(10-12):353-65.
Elam JW et al. "Conformal coating on ultrahigh-aspect-ratio nanopores of anodic alumina by atomic layer deposition," Chem. Mater. 2003;15:3507-17.
Elam JW et al., "Kinetics of the WF6 and Si2H6 surface reactions during tungsten atomic layer deposition," *Surf Sci.* 2001;479:121-35.
Giacchino L et al., "Parylene-membrane piezoresistive pressure sensors with XeF2-etched cavity," *IEEE Sensors*, held on 26-29 Oct. 26-29, 2008 in Lecce, Italy, pp. 1568-71.
Gordon RG et al., "A kinetic model for step coverage by atomic layer deposition in narrow holes or trenches," Chem. Vapor Deposition 2003;9(2):73-8.
Groner MD et al., "Low temperature A1203 atomic layer deposition," Chem. Mater. 2004;16: 639-45.
Kelkar SS et al., "Feature scale modeling of pulsed plasma-enhanced chemical vapor deposition," J. Vac. Sci. Technol. B 2014;32(5):052001 (8 pp.).
Kelkar SS, "Design and fabrication of asymmetric nanopores using pulsed Pecvd", Ph.D. thesis for Chemical and Biological Engineering, Colorado School of Mines (178 pp.).
Keuter T et al., "Modeling precursor diffusion and reaction of atomic layer deposition in porous structures," J. Vac. Sci. Technol. A 2015;33(1):01A104 (8 pp.).
Knoops Hcm et al., "Surface loss in ozone-based atomic layer deposition processes," Chem. Mater. 2011;23:2381-7.
Kornain Z et al., "Comparative study of different underfill material on flip chip ceramic ball grid array based on accelerated thermal cycling," Am. J. Eng. Appl. Sci. 2010;3(1):83-9.
Pardon G et al., "Pt-A1203 dual layer atomic layer deposition coating in high aspect ratio nanopores," *Nanotechnology* 2013;24:015602 (11 pp.).
Tan B, "Deep micro hole drilling in a silicon substrate using multi-bursts of nanosecond UV laser pulses," J. Micromech. Microeng. 2006;16:109-12.
Tao H et al., "Formation of strong light-trapping nano- and microscale structures on a spherical metal surface by femtosecond laser filament," AppL Phys. Lett. 2012;100:201111 (4 pp.).

* cited by examiner

US 9,972,565 B1

LATERAL VIAS FOR CONNECTIONS TO BURIED MICROCONDUCTORS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to a lateral via to provide an electrical connection to a buried conductor. In one instance, the buried conductor is a through via that extends along a first dimension, and the lateral via extends along a second dimension that is generally orthogonal to the first dimension. In another instance, the second dimension is oblique to the first dimension. Components having such lateral vias, as well as methods for creating such lateral vias are described herein.

BACKGROUND OF THE INVENTION

Stacked die for 3-dimensional integration (3-DI) are rapidly becoming a reality for commercial applications, including field-programmable gate arrays (FPGAs) and memory devices. Generally, 3-DI employs through silicon vias (TSVs) filled with a conductive material (e.g., Cu or W) to provide vertical electrical connections to a die. Further electrical pathways can be facilitated by using conductive solder bumps between a die and another component (e.g., another die, a circuit board, an interposer, etc.), in which such bumps are generally surrounded by a polymer underfill.

From a failure analysis perspective, 3-DI presents many challenges in order to access such electrical components, such as TSVs and solder bumps. For instance, the die of interest can be obstructed by other stacked die. Alternatively, the die of interest can be extremely thin and fragile, which can be difficult to handle. Many techniques involved with the preparation of 3-DI for failure analysis are destructive, in which a die has to be separated to access internal components, thereby resulting in loss of device functionality. Accordingly, there is an emerging need for semi-destructive processes to access and to connect targeted TSVs and/or solder bumps on 3-DI components, such as those that are sandwiched between the stacked die and/or are not accessible from the large faces of the die stack.

SUMMARY OF THE INVENTION

The present invention relates to lateral vias for accessing a buried conductor located within a component (e.g., a 3-DI device). In particular examples, the lateral via is useful for connecting to inaccessible conductors (e.g., targeted through silicon vias (TSVs) or solder bumps) that are sandwiched between stacked dies or that are located within a die stack. Described herein are structures for such lateral vias, as well as components and methods related to such structures.

Accordingly, in one aspect, the present invention relates to a component including: a buried conductor disposed within the component, where the buried conductor has a first longitudinal dimension extending along a length of the buried conductor; and a lateral via disposed within the component and configured to electrically connect to the buried conductor, where the lateral via has a second longitudinal dimension extending along a length of the lateral via and where the second longitudinal dimension is generally orthogonal or oblique to the first longitudinal dimension.

In some embodiments, the buried conductor is electrically inaccessible from an outer surface of the component. In other embodiments, the buried conductor is a through via or a solder bump.

In some embodiments, the component includes a plurality of lateral vias. In further embodiments, at least two of the plurality of lateral vias are configured to be electrically interconnected.

The component can have any useful features. In one embodiment, the component further includes: an underfill resin configured to surround the buried conductor, where the buried conductor is disposed within the underfill resin, and where the buried conductor has a first longitudinal dimension extending along a length of the buried conductor. In a further embodiment, the lateral via is disposed within the underfill resin and configured to electrically connect to the buried conductor, where the lateral via has a second longitudinal dimension extending along a length of the lateral via, and where the second longitudinal dimension is generally orthogonal or oblique to the first longitudinal dimension.

In another embodiment, the component further includes: a core including a top surface and a bottom surface, where the buried conductor is disposed within the core and extends between the top and bottom surfaces, and where the buried conductor has a first longitudinal dimension extending along a length of the buried conductor. In a further embodiment, the lateral via is disposed within the core and configured to electrically connect to the buried conductor, where the lateral via has a second longitudinal dimension extending along a length of the lateral via, and where the second longitudinal dimension is generally orthogonal or oblique to the first longitudinal dimension.

In yet another embodiment, the component further includes: a top layer extending along the top surface of the core; a bottom layer extending along the bottom surface of the core; and a first insulator portion configured to electrically isolate the buried conductor. In a further embodiment, the component includes a second insulator portion configured to electrically isolate the lateral via. In one non-limiting instance, the second insulator portion is disposed on a proximal portion of the lateral via.

In another embodiment, the component further includes: a bottom layer extending along the bottom surface of the component or the core, if present, where the bottom layer includes one or more conductive layers and one or more devices, and where the buried conductor is configured to electrically connect to at least one of the conductive layers. In yet another embodiment, the component further includes: an insulator portion disposed between the bottom layer and the bottom surface of the component or the core, if present, where the buried conductor extends through the insulator portion in order to be electrically accessible.

In a second aspect, the present invention also relates to a stack including a component (e.g., any component described herein). In one embodiment, the stack includes a component (e.g., any described herein) and a first die configured to be electrically connected to a first portion of the component. In another embodiment, the stack further includes: a second die configured to be electrically connected to a second portion of the component. The first and second portions of the component can be the same or different. Non-limiting, exemplary portions include one or more conductive structures (e.g., solder bumps, microbumps, etc.).

In a third aspect, the present invention relates to a method for creating a lateral via (e.g., any described herein), as well as methods for creating a component including such a lateral via. In one embodiment, the method includes: forming a microhole within a component including a buried conductor, where the microhole provides access to the buried conductor; and depositing a conductive material within the microhole to provide an electrical connection to the buried conductor, where the conductive material partially or completely fills the microhole.

In some embodiments, the component has a first longitudinal dimension extending between a top surface and a bottom surface of the component, and the microhole has a second longitudinal dimension extending along a length of the microhole. In particular embodiments, the second longitudinal dimension is generally orthogonal or oblique to the first longitudinal dimension. In other embodiments, the microhole includes a length to width ratio of from about 100 to about 50,000.

In some embodiments, the depositing step further includes providing the electrical connection between the buried connector and a portion of a circuit board.

In some embodiments, the forming step includes employing a laser (e.g., any described herein) to form the microhole. In particular embodiments, the employing step includes pulsed laser ablation, chemically-assisted pulsed laser ablation, continuous wave laser-assisted chemical etching, and/or pulsed wave laser-assisted chemical etching.

In some embodiments, the method further includes, after the forming step: depositing an insulative material within the microhole or a portion thereof. In some embodiments, the depositing an insulative material step includes atomic layer deposition of the insulative material.

In some embodiments, the depositing a conductive material step includes atomic layer deposition of the conductive material. In other embodiments, the depositing a conductive material step includes local heating by way of laser irradiation.

In some embodiments, the method further includes, before the forming step: applying a sacrificial coating to an outer surface of the component.

In any embodiment herein, the buried conductor includes a through via.

In any embodiment herein, the component and/or the core, if present, includes a semiconductor material.

In any embodiment herein, the lateral via includes: a conductive material including a contact region and an extended region, where the contact region is configured to electrically connect to the buried conductor and where the extended region is configured to extend into a portion of the component and/or the core, if present; and an insulator configured to contact the extended region, or a portion thereof.

In any embodiment herein, the conductive material (e.g., of the lateral via) includes a plurality of first and second layers, where a first layer includes a first metal, and where a second layer includes a second metal. Each of the first and second metals can be same or different. Furthermore, any useful multilayer can be employed, e.g., alternating layers of the first metal and the second metal.

In any embodiment herein, the component can further include an encapsulant disposed on an outer surface of the component, where the lateral via is configured to be electrically accessible. Additional details follow.

Definitions

As used herein, the term "about" means +/−10% of any recited value. As used herein, this term modifies any recited value, range of values, or endpoints of one or more ranges.

By "micro" is meant having at least one dimension that is less than 1 mm. For instance, a microstructure (e.g., any structure described herein) can have a length, width, height, cross-sectional dimension, circumference, radius (e.g., external or internal radius), or diameter that is less than 1 mm.

By "nano" is meant having at least one dimension that is less than 1 µm. For instance, a nanostructure (e.g., any structure described herein) can have a length, width, height, cross-sectional dimension, circumference, radius (e.g., external or internal radius), or diameter that is less than 1 µm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

The present invention relates to components and methods including one or more lateral vias. Typically, through vias are created by approaching the top side or the bottom side of a component. In this way, a vertical via (e.g., along the z-axis) is formed. By filling the vertical via with a conductive material, an electrical path is created along a vertical axis. In one non-limiting example, the present invention includes the use of a lateral via that is positioned along a non-vertical axis. For instance, the lateral via can extend along a direction (e.g., along a x-axis, along a y-axis, or within a xy-plane) that is generally orthogonal or oblique to the vertical axis.

Such lateral vias can be formed in any useful manner. In one non-limiting instance, a lateral via is created by fabricating a microhole along the side walls of a component, rather than along a top wall or a bottom wall of the component. Additional structural components and methods are described herein.

Figure 1A:
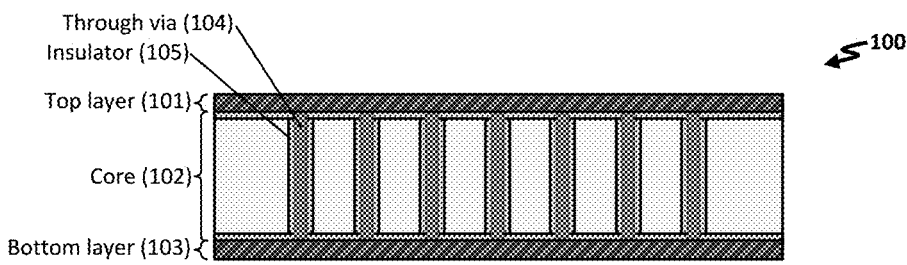
FIG. 1A-1G shows schematics of exemplary components including a buried conductor (e.g., a through via). Provided are an exemplary component 100 including a plurality of through vias 104 (FIG. 1A); another exemplary component 150 including a lateral via 160 configured to electrically connect to a through via 154 (FIG. 1B); yet another exemplary component 170 including a first lateral via 171 and a second lateral via 172 (FIG. 1C); and another exemplary component 180 having a first lateral via 181 and a second lateral via 182, in which the second lateral via 182 includes both an upper insulator portion 186 and a lower insulator portion 187 (FIG. 1D). Also provided are an exemplary component 1000 including two lateral vias (FIG. 1E), in which a first lateral via 1061 (FIG. 1F) is aligned at an orthogonal angle α between the first longitudinal dimension extending along the lateral via and a surface edge of the component at which the proximal end of the lateral via resides, and the first lateral via 1061 is configured to electrically connect to a buried first through via 1054 located towards the periphery of the component; and in which a second lateral via 1062 (FIG. 1G) is aligned at an oblique angle β between the second longitudinal dimension extending along the lateral via and a surface edge of the component at which the proximal end of the lateral via resides, and the second lateral via 1062 is configured to electrically connect to a buried second through via 1154 located towards the center of the component.

A lateral via can be formed in any useful component. FIG. 1A provides an exemplary component 100 including a top layer 101, a bottom layer 103, and a core 102 disposed beneath the top and bottom layers 101,102. Disposed along a vertical axis (e.g., along the z-axis) of the component are through vias 104. Optionally, insulator portions 105 are provided, as needed, to electrically isolate various structures, such as through vias, the top layer, and/or the bottom layer.

In this configuration, the component 100 provides vertically accessible electrical conduits. For instance, each through via is arranged to extend along the vertical axis, and the top and bottom layers can be configured to spatially address each through via. Thus, an electrical connection to a particular through via can be formed by accessing a particular portion of the top layer and a particular portion of the bottom layer.

Figure 1B:
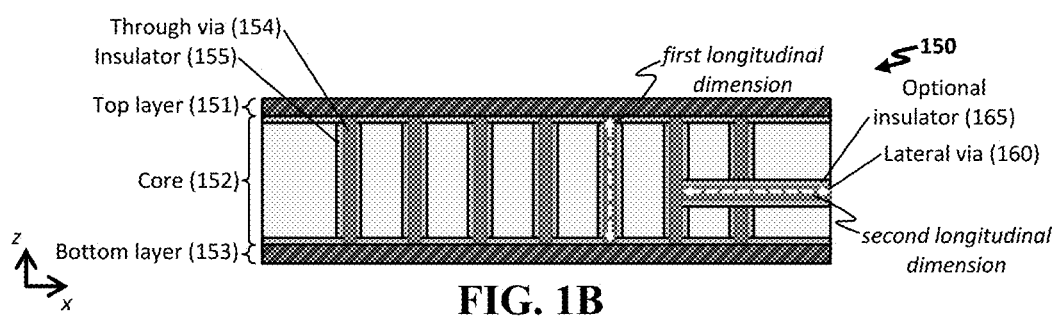

Three-dimensional connections could be facilitated by using more than just vertical connections. Additional dimensionality can be achieved by providing non-vertical connection, e.g., by way of using lateral vias. FIG. 1B provides an exemplary, non-limiting component 150 that includes a non-vertical electrical connection by way of a lateral via 160. As can be seen, the component 150 includes a top layer 151, a core 152 having a plurality of through vias 154, and a bottom layer 153. Insulator portions 155 are provided to electrically isolate each through via 154, as well as to isolate the top layer 151 from the bulk portion of the core 152 and to isolate the bottom layer 153 from the bulk portion of the core 152. Optionally, metallization can be provided in the top and bottom layers to individually access each through via in a selective manner.

A lateral via can be arranged in any useful manner. As seen in FIG. 1B, each through via 154 extends along a first longitudinal dimension, in which this first direction is generally orthogonal to a plane of the top surface of the component. In this non-limiting instance, the first dimension extends along the z-axis. In contrast, the lateral via 160 extends along a second longitudinal dimension, and this second dimension is not parallel to the first dimension. In this non-limiting instance, the second dimension is orthogonal to the first dimension (e.g., extends along the x-axis). In another instance, the second dimension extends along a direction that is different than that of the first dimension. In yet another instance, the second dimension is oblique to the first dimension.

By ensuring that the first and second dimensions are different, additional dimensionality is achieved. In addition, insulator portions can be employed, as needed, to electrically isolate a lateral via. In this way, spatial access to particular electrical paths can be controlled. In FIG. 1B, the lateral via 160 includes an optional insulator portion 165, in which the insulator portion is removed from the contact region disposed between the conductive portion of the through via and the conductive portion of the lateral via.

Figure 1C:
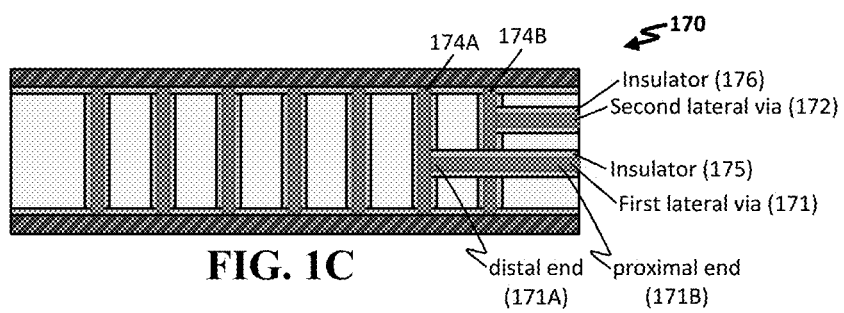

Different electrical paths can be formed by using a plurality of lateral vias. FIG. 1C provides an exemplary component 170 including a first lateral via 171 configured to electrically connect to a first targeted buried connector (e.g., a through via 174A), as well as a second lateral via 172 configured to electrically connect to a second targeted buried connector (e.g., a through via 174B). The lateral via can include a conductive portion and an optional insulator portion. Insulator portions 175,176 can be present in any useful manner, so long as the electrical path is configured to remain between the conductive portions of the lateral via and the buried connector.

Figure 1D:
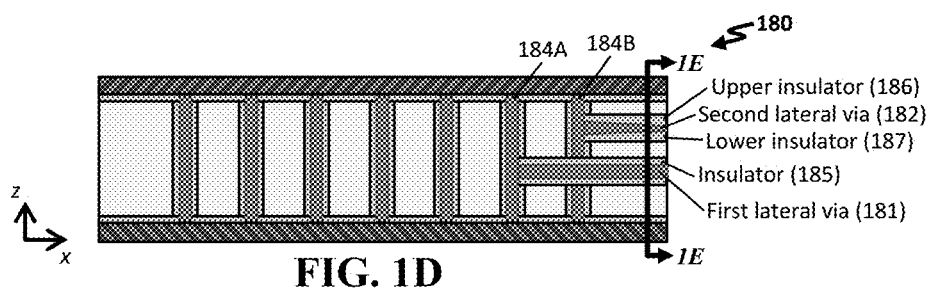

A lateral via can include any useful arrangement of the insulator portion(s). In one instance, the insulator portion can extend along the entire length (e.g., along the x-axis in FIG. 1D) of the lateral via. Alternatively, the insulator portion can extend only a portion of the length of the lateral via (e.g., extending only along proximal end of the lateral via). FIG. 1D provides yet another exemplary component 180 including a first lateral via 181 configured to electrically connect to a first through via 184A, as well as a second lateral via 182 configured to electrically connect to a second through via 184B. Here, the first lateral via 181 includes an insulator portion 185 disposed along the length of the conductive portion of the lateral via. The insulator portions can have a varied geometry. For instance, as seen in FIG. 1D, the second lateral via 182 includes both an upper insulator portion 186 disposed within a top region of the lateral via and a lower insulator portion 187 disposed within a bottom region of the lateral via, and the upper and lower insulator portions 186,187 have a varied thickness along the longitudinal dimension (e.g., along the x-dimension) of the lateral via 182. Similarly, the conductive portion of a lateral via can have a constant thickness or a varied thickness along the longitudinal dimension (e.g., along the x-dimension).

The conductive portion of the lateral via can include any useful material (e.g., a conductive material) provided in any useful manner (e.g., a single material, as well as layers, alloys, or composites of two or more materials). In one non-limiting instance, the conductive portion of the lateral via is composed of a single conductive material. In another non-limiting instance, the conductive portion of the lateral via is composed of two or more different conductive materials (e.g., layers of two or more different materials, including interleaving layers, axially arranged layers, alternating layers of two or more materials, etc.). In yet another non-limiting instance, the conductive portion of the lateral via is composed of two or more materials, in which at least one is a conductive material (e.g., a composite including a conductive material dispersed within a bulk, non-conductive or semiconductive material).

In one non-limiting instance, the lateral via includes one or more materials deposited by way of atomic layer deposition (ALD). Conductive, insulative, and semiconductive materials can be deposited by ALD, in which exemplary materials and further deposition processes are described herein. In one non-limiting instance, the lateral via includes an insulator portion formed by ALD and a conductive portion formed by ALD. In a further instance, the conductive portion includes layers of at least two different materials (e.g., axially arranged in a ABAB pattern along the second longitudinal dimension of the lateral via, in which A and B are dissimilar conductive materials, such as any described herein).

Figure 1E:
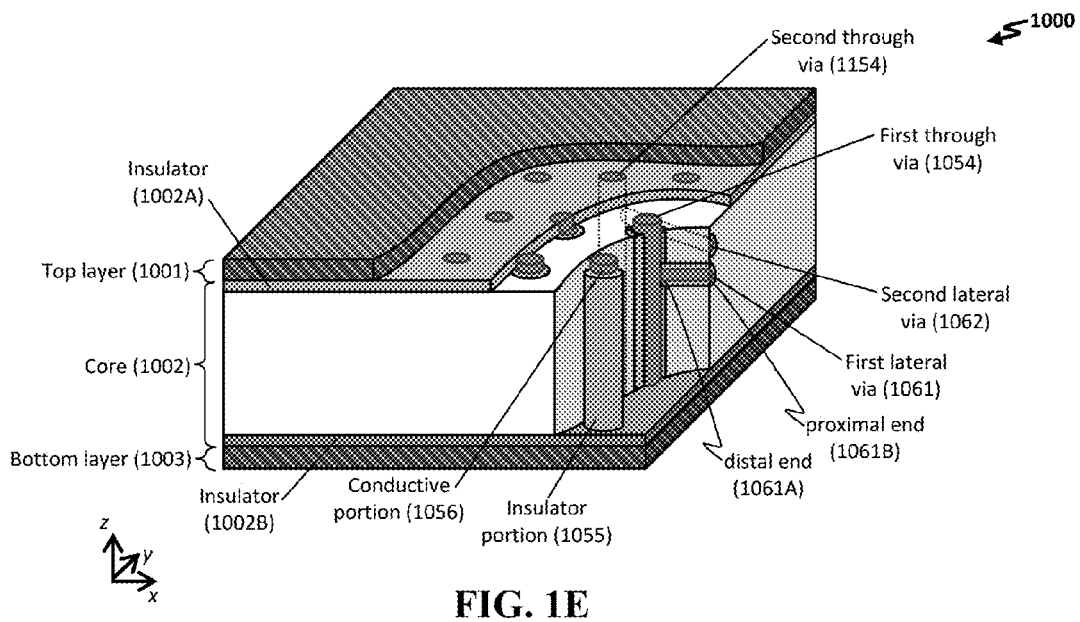
Figure 1F:
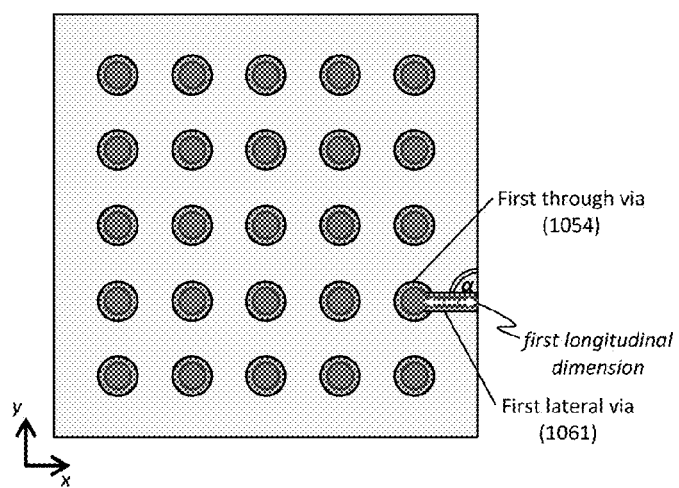
Figure 1G:
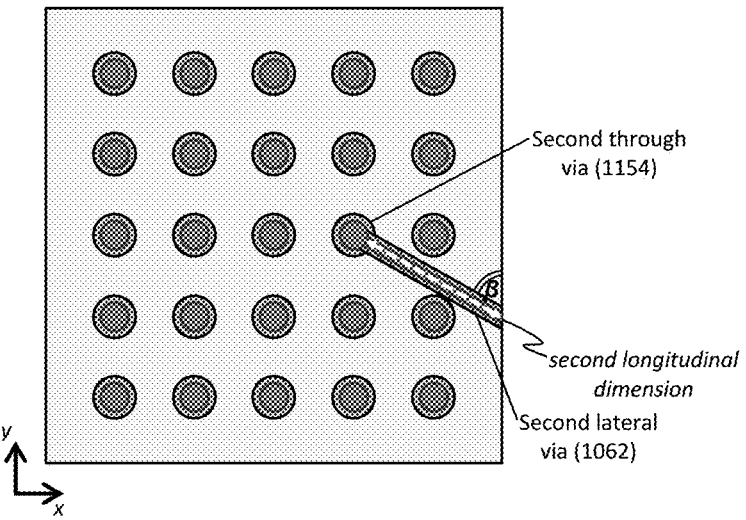

Lateral vias can be formed to contact any useful buried connector. For instance, FIG. 1B-1D describes lateral vias to access a buried connector that is a through via. FIG. 1E-1G describes lateral vias having different alignments in order to access different buried connectors. For instance, FIG. 1E provides a component 1000 having a top layer 1001, a core 1002 having insulator layers 1002A,1002B, and a bottom layer 1003. Within the component, various through vias are provided, including a first through via 1054 and a second through via 1154 extending along the vertical axis (e.g., the z-dimension). Each through via includes a conductive portion 1056 and an insulator portion 1055. In addition, a first lateral via 1061 is configured to electrically connect to the first through via 1054, and a second lateral via 1062 is configured to electrically connect to the second through via 1154. A proximal end 1061B of the lateral via 1061 is located towards an outer surface of the component 1000, and a distal end 1061A is located towards the center of the component 1000.

The lateral via can be aligned in any useful manner. As seen in FIG. 1E, the first lateral via 1061 is aligned at an orthogonal angle α between the first longitudinal dimension extending along the lateral via and a surface edge of the component 1000 at which the proximal end 1061B of the lateral via resides. Such an angle α may be beneficial to provide the most direct path to buried connectors located on a periphery of the component (e.g., located towards an accessible outer surface of the component). Alternatively, connectors located within the component may require access, but such a direct path could lead to electrical contacts with multiple connectors located throughout the component. In such an instance, an angled or oblique approach may be required. An exemplary embodiment of such an oblique approach is provided in FIG. 1G. As can be seen, the second lateral via 1062 is aligned at an oblique angle α, thereby avoiding contact with the conductive portion of the first through via 1054 but providing contact with the second through via 1154. Again, α is defined as the angle between the longitudinal dimension extending along the lateral via and a surface edge of the component at which the proximal end 1061B of the lateral via resides.

Figure 2A:
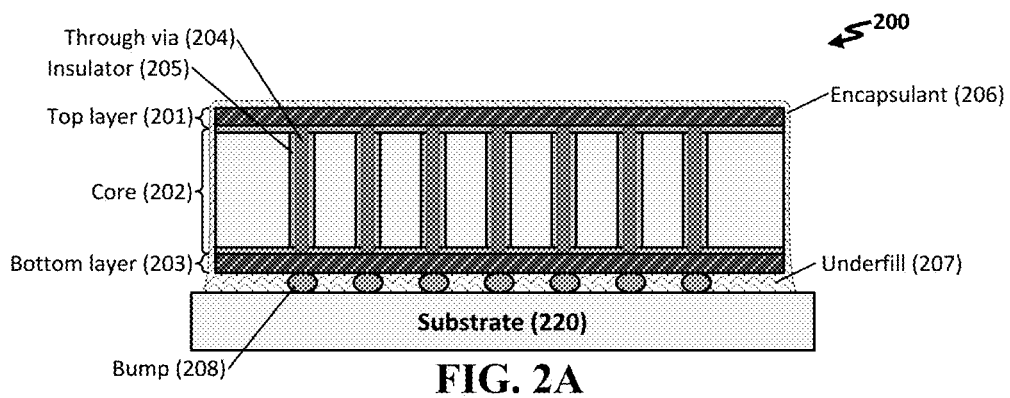
FIG. 2A-2B shows schematics of another exemplary component disposed on a substrate and including an encapsulant. Provided are an exemplary component 200 including a plurality of through vias 204, a plurality of solder bumps 208, and an encapsulant 206 disposed on an outer surface of the component 200 and further disposed between the solder bumps 208 (FIG. 2A); and another exemplary component 250 including a lateral via 260 that is configured to electrically connect to a solder bump 258 and that is electrically accessible (FIG. 2B).
Figure 2B:
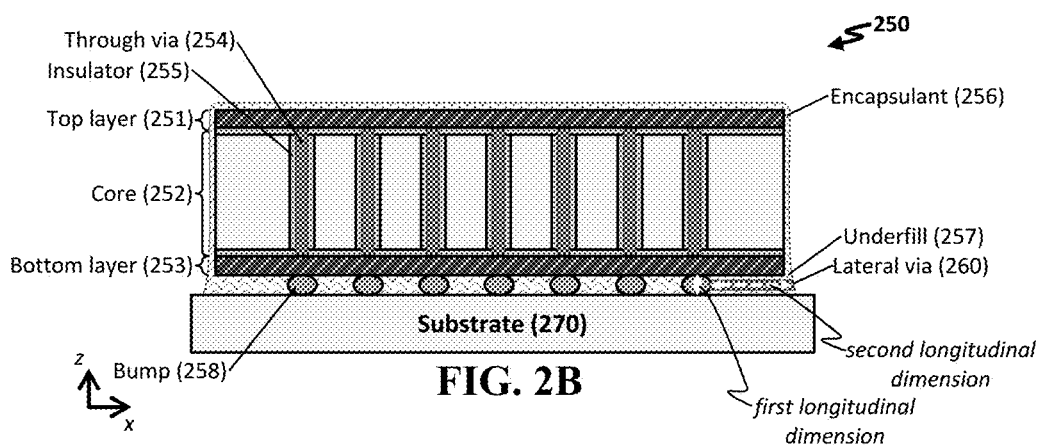

FIG. 2A provides a stack having a buried connector that is a solder bump, and FIG. 2B provides an exemplary lateral via configured to electrically connect to the solder bump.

FIG. 2A provides an exemplary component 200 including a top layer 201; a bottom layer 203; a core 202 disposed beneath the top and bottom layers 201,202; an array of solder bumps 208; and a substrate 220. The core 202 includes an array of through vias 204 that includes insulator portions 205 to electrically isolate the through vias 204. Electrical pathways are formed from a portion of the top layer 201, to a through via 204, and then to a portion of the bottom layer 203 and out of the core. Then, the electrical pathway continues through the array of solder bumps 208 and finally into the substrate 220 (e.g., a circuit board).

Fragile electrical connections (e.g., between the bottom layer 203 and the solder bumps 208) can be stabilized by use of an encapsulant 206, which can be further employed as an underfill 207 that adheres to the interface between the solder bumps 208 and the substrate 220. Exemplary materials for an underfill include a polymer, a resin (e.g., an epoxy resin), an adhesive (e.g., a cyanate ester), a sealant, etc., including one or more useful fillers (e.g., particles, powders, such as those derived from aluminum oxide or silica).

FIG. 2B provides an exemplary component 250 having a lateral via 260 configured to electrically connect to a solder bump 258. The component 250 includes a top layer 251; a bottom layer 253; a core 252 disposed beneath the top and bottom layers 251,252 and having an array of through vias 254 with insulator portions 255; an array of solder bumps 258; a substrate 270; an encapsulant 256, in which a portion serves as an underfill 257; and a lateral via 260 to access at least one solder bump.

The lateral via can be positioned in any useful manner. In one non-limiting instance, as seen in FIG. 2B, the solder bump 258 is a buried conductor, in which the buried conductor has a first longitudinal dimension extending along its length. The lateral via 260 is positioned to have a second longitudinal dimension extending along a length of the lateral via, in which this second dimension is generally orthogonal or oblique to the first dimension of the solder bump 258.

The lateral via can be used to form electrical connections, as well as any other type of connection requiring controlled transfer of energy. Such transfer mechanisms include, but are not limited to, thermal transfer, radiofrequency transmission, and optical transmission. In such uses, the buried conductor and/or the lateral via can be formed from a material that facilitates thermal, radiofrequency, or optical signals; and the insulator portions can be formed from a material that reduces the transmission of thermal, radiofrequency, or optical signals.

In any component herein, the top and bottom layers can be any useful layer, such as those including one or more electrical interconnects, insulators, and/or devices (e.g., one or more transistors, resistors, active circuity, etc.). Exemplary top and/or bottom layers include a frontside metal layer, a backside metal layer, a redistribution layer, a dielectric layer, and/or a metallization layer. The core can be any useful substrate (e.g., a semiconductor substrate), with optional insulator layers between a top surface of the core and the top layer and/or between a bottom surface of the core and the bottom layer.

Any useful component can be adapted to include one or more lateral vias. Exemplary components include an integrated circuit or a component thereof (e.g., a field-programmable gate array), a chip, a package, a device (e.g., a microelectronic device, a memory device, a logic device, etc.), a substrate (e.g., a semiconductor substrate or an interposer), an assembly, a stack, a die, or combinations thereof.

Methods

The present invention also relates to methods of creating a lateral via within a component. In one non-limiting embodiment, the method includes forming a microhole within a component (e.g., by approaching a side wall of the component, in which the component includes one or more buried conductors) and depositing a conductive material within the microhole to provide an electrical connection to the buried conductor.

The microhole can be positioned along the direction that will ultimately provide the longitudinal dimension of the lateral via. In one non-limiting instance, the component includes one or more through vias, in which the through via is formed by approaching the top side or the bottom side of the component; and the microhole is formed by approaching a sidewall of the component. In another non-limiting instance, a through via is formed to include a longitudinal dimension that extends along a first direction, and the microhole is formed to include a longitudinal dimension that extends along a second direction that is different from the first direction. In yet another non-limiting instance, the microhole is formed to extend along a direction (e.g., along a x-axis, along ay-axis, or within a xy-plane) that is generally orthogonal or oblique to the vertical axis (e.g., along a z-axis).

Once the microhole is created, one or more insulative materials and/or conductive materials can be deposited within the microhole to form a lateral via. One or more additional subtractive steps can be implemented to fabricate and/or refine the microhole; and one or more additional additive steps can be implemented to provide sacrificial layer(s), conductive material(s), and/or insulative material(s).

Figure 3A:
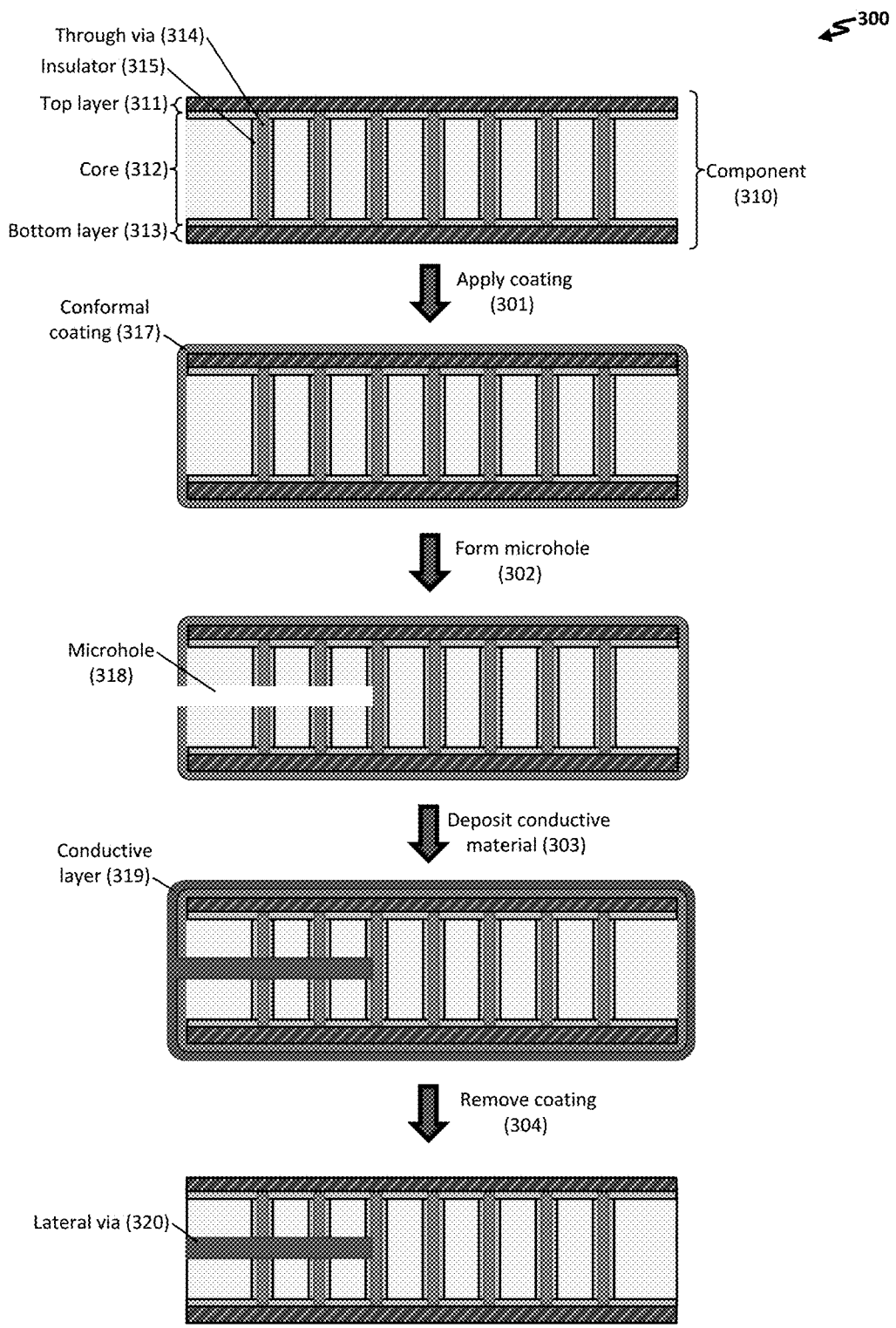
FIG. 3A-3D shows schematics of exemplary methods for creating a lateral via. Provided are an exemplary method 300 that includes forming 302 a microhole within the component and then depositing 303 a conductive material to form a lateral via 320 (FIG. 3A); another exemplary method 350 that includes providing 353 a clearance hole prior to forming 354 a microhole within the component and then depositing 355 an insulator within the microhole (FIG. 3B-3C); and an exemplary component including a filled lateral via 380 (FIG. 3D).

FIG. 3A provides an exemplary method 300 to create a lateral via 320 within a component. The method 300 includes applying 301 a coating on the component, forming 302 a microhole, depositing 303 one or more conductive materials (e.g., any herein), and removing 304 the coating.

In one non-limiting instance, the method 300 includes providing a component 310, which includes a top layer 311; a bottom layer 313; a core 312 disposed beneath the top and bottom layers 311,313 and having an array of through vias 314; and insulator portions 315 disposed between conductive or semiconductive elements. The exemplary method 300 further includes applying 301 a coating (e.g., a sacrificial layer), such as a conformal coating 317 on an outer surface of the component (or a portion of the outer surface of the component); and forming 302 a microhole 318 within the component.

Microholes can be made by various subtractive techniques (e.g., by sputtering, etching, or ablating the component, or a portion thereof). In one example, a focused or unfocused beam of ions or neutral particles can be positioned across a surface of the component to remove material from selected sites. Focused laser light can, alternatively, ablate material to form microholes or stimulate the formation of volatile etch products. In one instance, material removal can involve a mask for feature definition over large areas. Exemplary methods can include plasma etching, Bosch etching (e.g., a deep reactive ion etching (Bosch DRIE) process), a cryogenic DRIE process, a laser drilling process, focused ion beam sputtering, laser ablation (e.g., pulsed laser ablation, chemical-assisted pulsed laser ablation, gas-assisted laser ablation, or filamentary laser micromachining), interference lithography, selective vapor-phase etching (e.g., vapor phase $XeF_2$ etching), other anisotropic etching techniques, or even a wet etching process (an isotropic etching process), as well as combinations of any of these techniques. For instance, treating a surface with energetic material (e.g., ions, photon irradiation, or incident beams) can damage regions of the component, and these damaged regions can be preferentially removed by exposing the surface to an etchant, an acid, or an oxidative solution. In another instance, microholes can be formed using both skeletal and targeted single-hole micromachining, in which a skeletal etch can be used to remove the material to some depth and then a targeted single hole can be micromachined.

One or more masks may be used to form the microhole. In one instance, the method includes providing a component, defining microhole(s) within the component (e.g., by plasma etching), and depositing one or more materials within the microhole(s) (e.g., by atomic layer deposition). In particular embodiments, the method includes providing a component, depositing a resist layer on a surface of the component, and patterning the resist layer to form a patterned resist layer having apertures. These apertures can be etched (e.g., by plasma etching) to form one or more microholes within the component.

The microhole can be positioned in any useful manner that allows access to the buried connector (e.g., buried through via or buried solder bump). In one non-limiting instance, the component has a first longitudinal dimension extending between a top surface and a bottom surface of the component, and the microhole has a second longitudinal dimension extending along a length of the microhole. In particular embodiments, the second longitudinal dimension is generally orthogonal or oblique to the first longitudinal dimension.

Microholes can have any useful pattern or geometry. Exemplary patterns include periodic and aperiodic patterns. Exemplary geometries include pores, cylinders, spheres, spheroids, as well as irregular geometric shapes. Each microhole within the component can have same or different geometries. In addition, the pattern of openings can be uniform.

The dimensions of the microholes can also be modified to control the electrical connection to the buried connector. In one instance, the opening has a high aspect ratio, e.g., a ratio of a first dimension (e.g., a width of the microhole or a dimension along the z-axis) and a second dimension (e.g., a length of the microhole, a dimension along the x-axis, or a dimension within the xy-plane) that is of from about 1:5 to about 1:50,000, e.g., 1:5 to 1:40,000, 1:5 to 1:30,000, 1:5 to 1:20,000, 1:5 to 1:10,000, 1:5 to 1:5,000, 1:5 to 1:1,000, 1:5 to 1:750, 1:5 to 1:500, 1:5 to 1:250, 1:5 to 1:100, 1:5 to 1:50, 1:5 to 1:25, 1:5 to 1:10, 1:10 to 1:40,000, 1:10 to 1:30,000, 1:10 to 1:20,000, 1:10 to 1:10,000, 1:10 to 1:5,000, 1:10 to 1:1,000, 1:10 to 1:750, 1:10 to 1:500, 1:10 to 1:250, 1:10 to 1:100, 1:10 to 1:50, 1:10 to 1:25, 1:50 to 1:40,000, 1:50 to 1:30,000, 1:50 to 1:20,000, 1:50 to 1:10,000, 1:50 to 1:5, 000, 1:50 to 1:1,000, 1:50 to 1:750, 1:50 to 1:500, 1:50 to 1:250, 1:50 to 1:100, 1:100 to 1:40,000, 1:100 to 1:30,000, 1:100 to 1:20,000, 1:100 to 1:10,000, 1:100 to 1:5,000, 1:100 to 1:1,000, 1:100 to 1:750, 1:100 to 1:500, 1:100 to 1:250, 1:500 to 1:40,000, 1:500 to 1:30,000, 1:500 to 1:20,000, 1:500 to 1:10,000, 1:500 to 1:5,000, 1:500 to 1:1,000, 1:500 to 1:750, 1:1,000 to 1:40,000, 1:1,000 to 1:30,000, 1:1,000 to 1:20,000, 1:1,000 to 1:10,000, 1:1,000 to 1:5,000, 1:2,000 to 1:40,000, 1:2,000 to 1:30,000, 1:2,000 to 1:20,000, 1:2,000 to 1:10,000, 1:2,000 to 1:5,000, 1:5,000 to 1:40,000, 1:5,000 to 1:30,000, 1:5,000 to 1:20,000, 1:5,000 to 1:10,000, 1:10,000 to 1:40,000, 1:10,000 to 1:30,000, and 1:10,000 to 1:20,000.

The microhole can have any useful characteristic dimension, such as a length, width, height, radius, thickness, diameter, etc. The dimension can be less than 400 µm or of from about 0.01 µm to about 400 µm (e.g., 0.01 µm, to 400 µm, 0.01 µm to 300 µm, 0.01 µm to 250 µm, 0.01 µm 200 µm, 0.01 µm to 150 µm, 0.01 µm to 100 µm, 0.01 µm to 75 µm, 0.01 µm to 50 µm, 0.01 µm to 25 µm, 0.01 µm to 10 µm, 0.01 µm to 5 µm, 0.01 µm to 1 µm, 0.01 µm to 0.5 µm, 0.01 µm to 0.1 µm, 0.1 µm to 400 µm, 0.1 µm to 300 µm, 0.1 µm to 250 µm, 0.1 µm to 200 µm, 0.1 µm to 150 µm, 0.1 µm to 100 µm, 0.1 µm to 75 µm, 0.1 µm to 50 µm, 0.1 µm to 25 µm, 0.1 µm to 10 µm, 0.1 µm to 5 µm, 0.1 µm to 1 µm, 0.1 µm to 0.5 µm, 0.5 µm to 400 µm, 0.5 µm to 300 µm, 0.5 µm to 250 µm, 0.5 µm to 200 µm, 0.5 µm to 150 µm, 0.5 µm to 100 µm, 0.5 µm to 75 µm, 0.5 µm to 50 µm, 0.5 µm to 25 µm, 0.5 µm to 10 µm, 0.5 µm to 5 µm, 0.5 µm to 1 µm, 1 µm to 400 µm, 1 µm to 300 µm, 1 µm to 250 µm, 1 µm to 200 µm, 1 µm to 150 µm, 1 µm to 100 µm, 1 µm to 75 µm, 1 µm to 50 µm, 1 µm to 25 µm, 1 µm to 10 µm, 1 µm to 5 µm, 5 µm to 400 µm, 5 µm to 300 µm, 5 µm to 250 µm, 5 µm to 200 µm, 5 µm to 150 µm, 5 µm to 100 µm, 5 µm to 75 µm, 5 µm to 50 µm, 5 µm to 25 µm, 5 µm to 10 µm, 10 µm to 400 µm, 10 µm to 300 µm, 10 µm to 250 µm, 10 µm to 200 µm, 10 µm to 150 µm, 10 µm to 100 µm, 10 µm to 75 µm, 10 µm to 50 µm, 10 µm to 25 µm, 25 µm to 400 µm, 25 µm to 300 µm, 25 µm to 250 µm, 25 µm to 200 µm, 25 µm to 150 µm, 25 µm to 100 µm, 25 µm to 75 µm, 25 µm to 50 µm, 50 µm to 400 µm, 50 µm to 300 µm, 50 µm to 250 µm, 50 µm to 200 µm, 50 µm to 150 µm, 50 µm to 100 µm, 50 µm to 75 µm, 100 µm to 400 µm, 100 µm to 300 µm, 100 µm to 250 µm, 100 µm to 200 µm, 100 µm to 150 µm, 200 µm to 400 µm, 200 µm to 300 µm, 200 µm to 250 µm, 250 µm to 400 µm, 250 µm to 300 µm, 300 µm to 400 µm, or 350 µm to 400 µm).

As further seen in FIG. 3A, the method 300 includes depositing 303 a conductive material (e.g., any described herein) to partially or entirely fill the microhole. The deposited material forms a conductive layer 319. The depositing step can be repeated, as needed, to achieve the desired characteristic of the conductive layer. In one non-limiting instance, the depositing step can be repeated to achieve a desired thickness of the conductive layer.

Once microholes are defined in a component, these can be filled with one or more insulative and/or conductive materials to create a lateral via. Methods for filling openings include any useful technique, such as chemical vapor deposition and/or atomic layer deposition. The additional material could infiltrate microholes to completely fill or partially fill the solid.

Materials can be deposited in microholes in any useful manner. Exemplary techniques include physical vapor deposition (PVD), chemical vapor deposition (CVD), plasma enhanced CVD (PE-CVD), low pressure CVD (LP-CVD), atomic layer deposition (ALD), sputter deposition, electron-beam deposition, etc., such as those techniques described in Aaltonen T et al., "Atomic layer deposition of platinum thin films," *Chem. Mater.* 2003;15(9):1924-8 and Adams DP, "Reactive multilayers fabricated by vapor deposition: a critical review," *Thin Solid Films* 2015;576:98-128, each of which is incorporated herein by reference in its entirety. After deposition, one or more additional fabrication steps can be conducted, such as optional planarization (e.g., to from a uniform, planar surface of the stack, such as by etching or abrading the surface, thereby removing a portion of a deposited reactant), optional deposition of an insulative material, Atomic layer deposition is an additive vapor deposition method that can be used for low temperature, conformal deposition of insulative and/or conductive materials. A material is deposited as a layer through sequential self-limited steps (called half reactions), keeping the precursor materials separate during the half reactions. ALD has been used to deposit metals or metal oxides, including W, Pt, Ir, Pd, Ag, Ta, Ni, Co, Er, NiO, $Co_3O_4$, MnO, $WO_3$, $SnO_2$, $Bi_2O_3$, and $Ta_2O_3$. ALD processes provide excellent film thickness uniformity, especially when coating an opening having a high aspect ratio. In some instances, ALD is employed for growing layers into a through via contained on a substrate. Microholes may be completely or partially filled by ALD by limiting the number of chemical steps.

In addition, deposition techniques (e.g., ALD) may be used to deposit multiple materials into microholes to have a circumferentially-stratified structure. Deposition involving two different materials can be completed sequentially. Unlike previous methods involving sputtering and evaporative deposition, ALD can produce a well-defined, uniform, stratified multilayer structure within obscured openings (i.e., those that do not have direct line of sight to the vapor source). For example, circumferentially stratified, metal-metal multilayers can be deposited in one or more openings by ALD. Metal-metal oxide can also be deposited in a similar manner.

In one non-limiting instance, the depositing step can be repeated to achieve sequential deposition of different materials to form the conductive layer. For instance, ALD can be employed to achieve conformal layers of a first material alternating with a second material, in which these layers are deposited within the microhole. If the microhole is generally cylindrical, then layer-by-layer ALD can result in radially arranged layers of a first material, a second material, a first material, etc. that extends along the axis of the second longitudinal dimension (see, e.g., FIG. 6B).

As also seen in FIG. 3A, the method 300 further includes removing 304 the sacrificial coating, thereby releasing the component having a lateral via 320. The method can include one or more other steps, e.g., to accurately position the microhole, to provide complete deposition of one or more conductive materials, and/or to control deposition of one or more insulative materials.

Figure 3B:
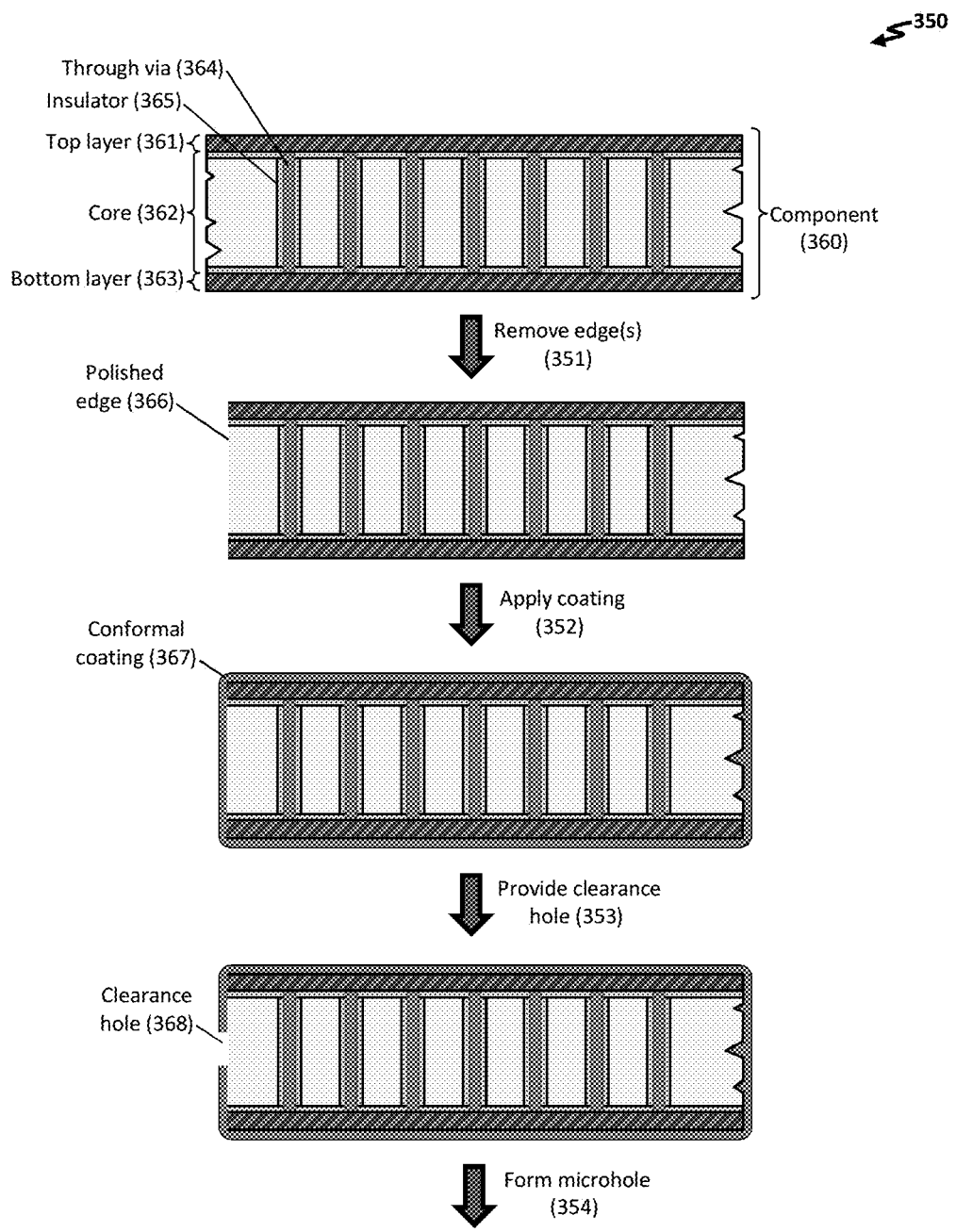
Figure 3C:
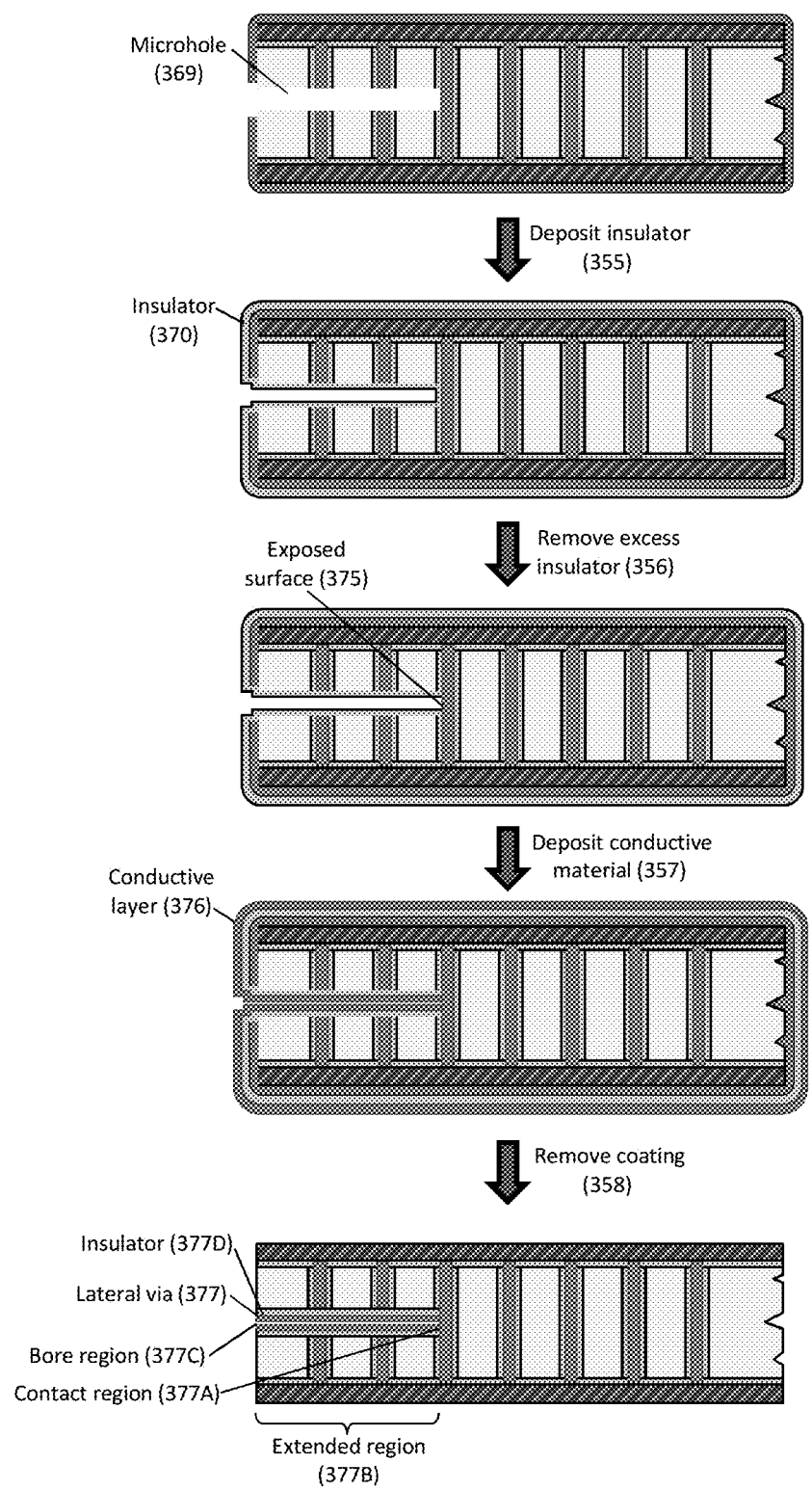

FIG. 3B-3C provides a further exemplary, non-limiting method 350 for creating a lateral via 377. The method 350 includes removing 351 an edge (e.g., a sidewall of the component, or a portion thereof), applying 352 a coating on the component, providing 353 a clearance hole, forming 354 a microhole, depositing 355 one or more insulative materials and optimally removing 356 any excess insulative material (e.g., thereby providing an exposed surface 375 upon which to form the contact region), depositing 357 one or more conductive materials (e.g., any herein), and removing 358 the coating, thereby releasing a component including a lateral via 377.

In one non-limiting instance, as seen in FIG. 3B-3C, the method 350 includes providing a component 360, which includes a top layer 361; a bottom layer 363; a core 362 disposed beneath the top and bottom layers 361,363 and having an array of through vias 364; and insulator portions 365 disposed between conductive or semiconductive elements. The exemplary method 350 further includes removing 351 an edge of the component 360 to provide a smooth, planarized surface (e.g., a polished edge 366). Then, the method includes applying 352 a coating (e.g., a sacrificial layer), such as a conformal coating 367 on an outer surface of the component (or a portion of the outer surface of the component); providing 353 a clearance hole 368; and forming 354 a microhole 369 within the component. The clearance hole 368 can be initially formed to control placement and alignment of the microhole 369. The microhole 369 can be fabricated to have a length that allows for an electrical connection to the buried connector.

A clearance hole can be associated with any useful number of microholes, thereby forming a plurality of lateral vias. In one non-limiting instance, a single clearance hole can be formed, and a single microhole can then be fabricated within that clearance hole. In another non-limiting instance, a single clearance hole can be formed, and a plurality of microholes can then be fabricated within that clearance hole. In this way, application of a conductive material within the microholes would result in a plurality of lateral vias that are electrically interconnected. Alternatively, after deposition of the conductive material, planarization can be employed to result in electrically isolated lateral vias.

Further additive steps can be conducted to deposit materials within the microhole. Such additive steps can include any techniques herein to provide one or more insulative materials and/or conductive materials in any useful arrangement or pattern. Furthermore, one or more etching steps can be conducted to remove excess or undesired deposited materials (e.g., and thereby providing access to a buried conductor by way of an electrical pathway). Accordingly, in one embodiment, the exemplary method 350 includes depositing 355 one or more insulative materials within the microhole 369, as well as on an outside surface of the component. One or more insulative materials may be deposited to form the insulator layer 370, and one or more layers including such insulative material(s) can also be deposited to form the insulator layer 370.

The insulator may be deposited on any surface of the microhole, including top, bottom, distal, proximal, and/or side surfaces of the microhole. Optionally, the method includes removing excess insulative material(s) within the microhole, thereby ensuring that the completed lateral via can form an electrical connection to a through via extending through a component. As seen in FIG. 3B-3C, the exemplary method can include removing 356 excess insulator material from the microhole, thereby forming an exposed surface 375 in proximity to the distal end of the microhole. In this way, any further deposited conductive material will fill in the exposed surface, thereby forming an electrical connection to a conductive via.

Next, the method can include depositing 357 a conductive material on a surface of the component, including surface(s) provided by the microhole. As seen in FIG. 3B-3C, a conductive layer 376 is formed having one or more conductive material(s) and/or one or more layers deposited on and/or within the component. Finally, one or more sacrificial coatings can be removed 358, thereby releasing the component having a lateral via 377 defined therein.

In one non-limiting embodiment, the conductive material of the lateral via can include a contact region and an extended region. The contact region is generally configured to electrically connect to the buried conductor, and the extended region is generally configured to extend into a portion of the component. As seen in FIG. 3B-3C, the lateral via 377 includes a contact region 377A, in which the conductive portion of the lateral via forms an electrical connection to a through via; and an extended region 377B. The internal bore region 377C of the lateral via may be filled or unfilled (e.g., with a conductive material that may be the same or different than the material forming the contact region of the lateral via).

Figure 3D:
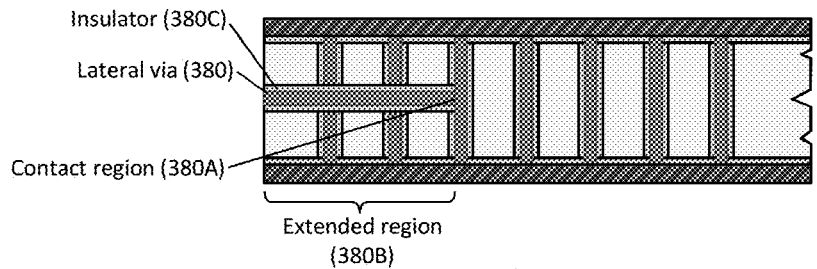

Optionally, the lateral via and further includes an insulator configured to contact the extended region, or a portion thereof In one particular embodiment, as seen in FIG. 3B-3C, the extended region 377B of a lateral via includes an internal bore region 377C and an external surface, in which an insulator 377D can be optionally disposed on the external surface of the extended region 377B (or on a portion of the external surface). In another non-limiting embodiment, as seen in FIG. 3D, the lateral via 380 includes a contact region 380A, in which the conductive portion of the lateral via forms an electrical connection to a through via; and an extended region 380B having an insulator 380C disposed a curved surface of the lateral via. Any useful combination of insulator(s) (e.g., portion(s) including one or more insulative materials) and conductor(s) (e.g., portion(s) including one or more conductive materials).

Figure 4A:
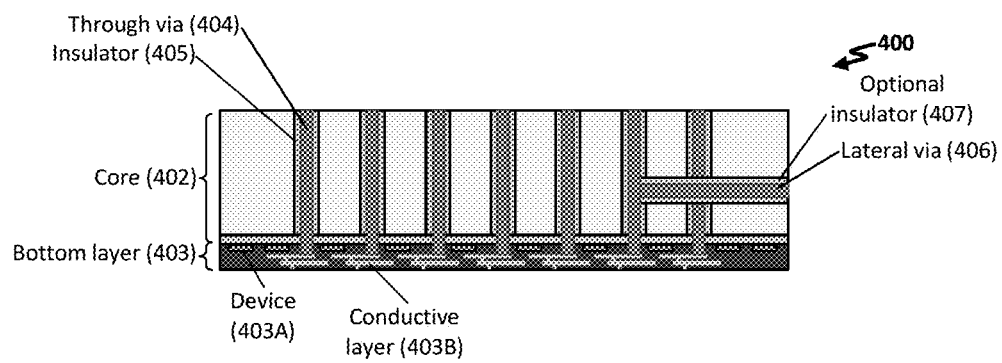
FIG. 4A-4C shows schematics of exemplary components with different structural bottom and top layers. Provided are an exemplary component 400 including a bottom layer 403 (FIG. 4A); another exemplary component 410 including a top layer 411 and a bottom layer 413 (FIG. 4B); and yet another exemplary component 450 that is a stack having a first die 451 and a second die 452 (FIG. 4C).

The lateral via can be disposed in any useful component in any useful manner, so long as the lateral via is configured to electrically connect to a buried conductor of the component. FIG. 4A provides an exemplary component 400 having a plurality of conductors buried within a core (e.g., a plurality of buried conductors, such as through vias 404). As can be seen, the component can include or exclude one or more layers, such as top layers or bottom layers. The component 400 in FIG. 4A excludes a top layer but includes a bottom layer 403 extending along a bottom surface of the core 402.

The component can include one or more insulator portions to electrically isolate any subcomponent. In one non-limiting instance, an insulator portion 405 is configured to electrically isolate a buried conductor, e.g., a through via 404. In another non-limiting instance, an insulator portion is configured to electrically isolate the bottom layer 403 (e.g., including one or more device 403A and/or conductive layers 403B within the bottom layer 403) from a semiconductor core 402. Any insulator portion can be a continuous layer, a layer including one or more openings (e.g., an insulator portion including one or more openings or vias to facilitate an electrical connection between a first conductor in a first portion of the component and a second conductor in a second portion of the component, such as an electrical connection between a through via 404 in the core 402 and a conductive layer 403B in the bottom layer 403), or a layer disposed on a portion of a surface (e.g., an insulator portion 407 disposed on a portion of the lateral via 406).

Figure 4B:
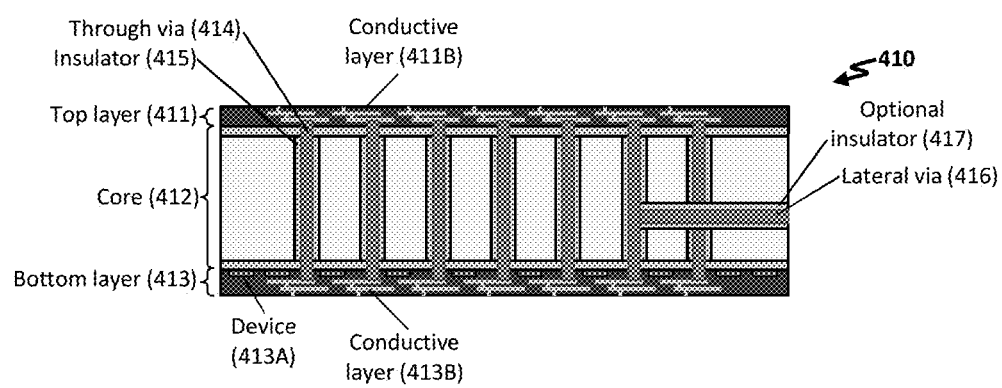

FIG. 4B provides another exemplary component 410 having a lateral via 416. As can be seen, the component 410 includes a core 412, top layer 411 extending along a top surface of the core, and a bottom layer 413 extending along a bottom surface of the core. Each of the top and bottom layers can include further subcomponents, such as devices 413A and/or conductive layers 411B,413B. Such conductive layers can be configured to provide spatially addressable pathways to buried connectors (e.g., each conductive layer can be configured to form an electrical connection to one buried connector). The core 412 can include one or more through vias 414 with optional insulator portions 415, as well as one or more lateral vias 416 with optional insulator portions 417.

Figure 4C:
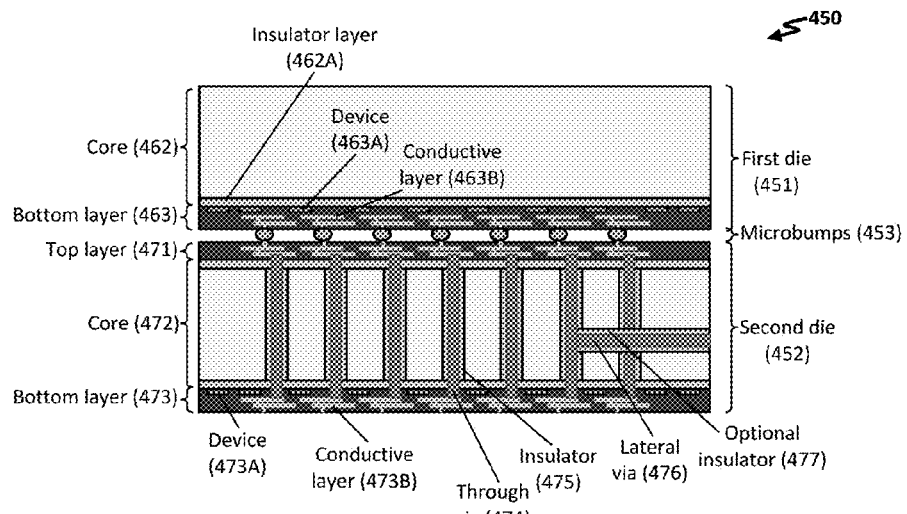

Lateral via(s) can be installed in any useful structure, including components, dies, interposers, as well as stacks thereof. FIG. 4C provides a non-limiting stack 450 having a first die 451 disposed on top of a second die 452. Electrical connections between the first and second dies can be accommodated in any useful manner, such as by use of solder bumps (e.g., microbumps 453) and arrays thereof. As can be seen, the first die 451 includes a core 462 (e.g., a semiconductor core) having an insulator layer 462A, as well as a bottom layer 463 extending along a bottom surface of the core. The bottom layer 463, in turn, can include one or more devices 463A and/or conductive layers 463B.

The second die can have any useful structure. As seen in FIG. 4C, one non-limiting embodiment of the second die 452 includes a core 472 (e.g., a semiconductor core), a top layer 471 extending along a top surface of the core, and a bottom layer 473 extending along a bottom surface of the core. The top and/or bottom layers 471,473, in turn, can include one or more devices 473A and/or conductive layers 473B. The core can include one or more buried connectors (e.g., through vias 474 with optional insulator portions 475), as well as one or more lateral vias 476 with optional insulator portions 477.

Figure 5:
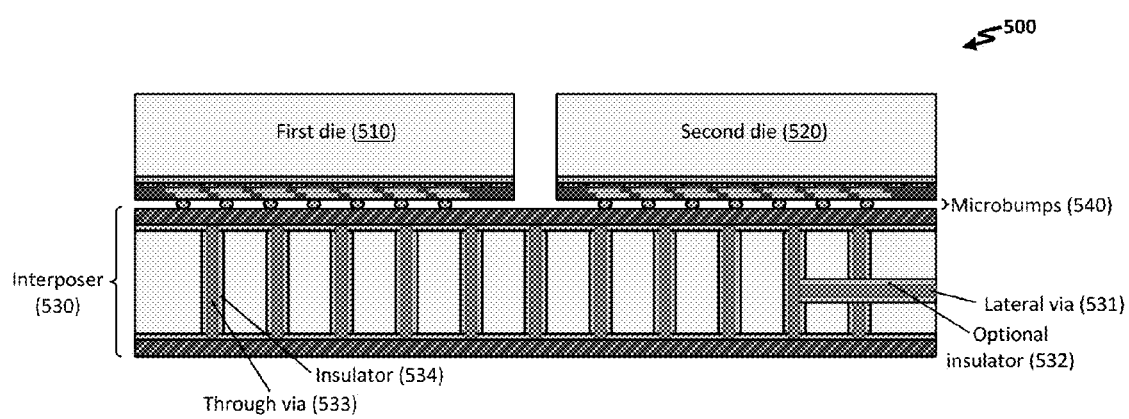
FIG. 5 shows a schematic of an exemplary component 500 having an interposer 530, in which a first die 510 and a second die 520 are each configured to be electrically connected to different portions of the interposer 530.

A stack can have any useful configuration. FIG. 5 provides a non-limiting embodiment of a stack 500 having dies 510,520 that are arranged upon an interposer 530. Electrical connections between the first die to the interposer, as well as the second die to the interposer, can be accommodated in any useful manner, such as by use of solder bumps (e.g., microbumps 540) and arrays thereof. The interposer 530 can have any useful configuration of buried connectors (e.g., through vias 533 with optional insulator portions 534) and lateral vias 531 with optional insulator portions 532.

Figure 6A:
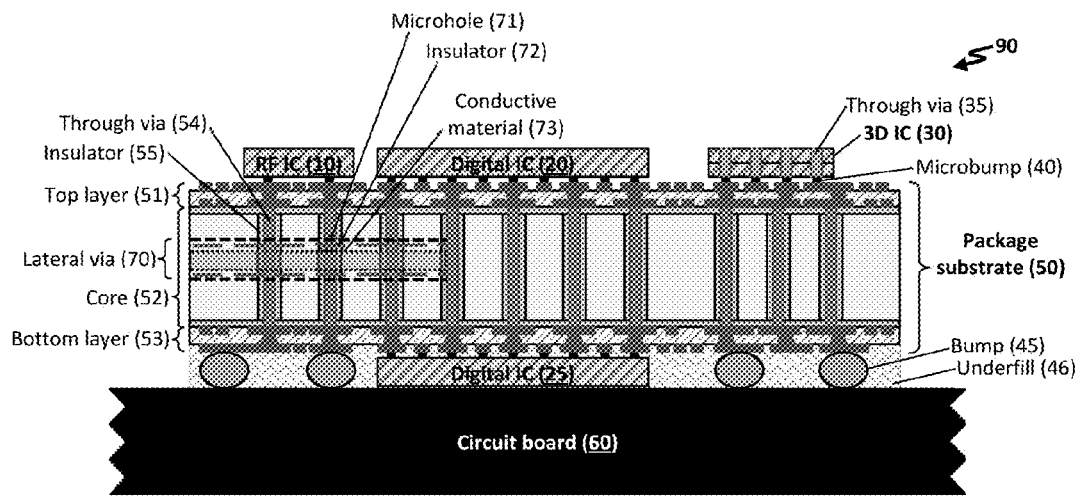
FIG. 6A-6E shows schematics of exemplary components and methods for creating a lateral via within a stack. Provided are an exemplary component 90 including a lateral via 70 within the core 52 of a package substrate 50 (FIG. 6A); yet another exemplary component 700 including a lateral via 770 having layers of two or more conductive materials 773 (FIG. 6B); and an exemplary method creating a lateral via 617 within a stack (FIG. 6C-6E).

FIG. 6A provides yet another non-limiting embodiment of a stack 90 having one or more integrated circuit (IC) components 10,20,25,30 and a package substrate 50, which in turn are configured to be electrically connected to a circuit board 60. As can be seen, the radiofrequency integrated circuit (RF IC) component 10, the digital IC components 20,25, and the 3D IC component 30 are configured to be electrically connected to the package substrate 50 by way of conductive solder bumps (e.g., microbumps 40). In turn, the package substrate 50 is configured to be electrically connected to the circuit board 60 by way of conductive solder bumps (e.g., bumps 45) that forms an electrical pathway with a through via 54. One or more encapsulants can be employed as an underfill 46 configured to surround and/or stabilize buried electrical connections (e.g., a solder bump).

One or more components within the stack can include a buried connector. As seen in FIG. 6A, the 3D IC component 30 can include a vertical through via 35, and the package substrate 50 can include one or more through vias 54 having optional insulator portions 55. Access to such buried connectors (e.g., through vias) can be provided with a lateral via, which in turn can be formed in any useful manner. In one non-limiting instance, the lateral via 70 is formed within a microhole 71 having one or more insulator portions 72 and a deposited conductive material 73. The microhole 71 can be formed within the core and configured to provide contact regions between the conductive material 73 and one or more through via 54. Optionally, a lateral via can be provided through the underfill 46 to provide access to a solder bump 45.

An electrical pathway through the stack can be formed in any useful manner. In one non-limiting instance, FIG. 6A provides an electrical pathway traveling from a component, through the package substrate, and then to the circuit board. One non-limiting electrical pathway (from the bottom to the top of the stack) begins from the circuit board 60, through a solder bump 45, to one or more conductive layers (e.g., one or more metal interconnects, interlayer vias, trace conductors, metal lines, wires, etc.) within the bottom layer 53, to a through via 54 within the core 52, optionally to a lateral via 70 if in electrical contact with a target through via, to one or more conductive layers within the top layer 51, through a microbump 40, and then to a component (e.g., an RF IC component 10, a digital IC component 20, or a 3D IC component 30).

Within a stack, the lateral via can be formed with any useful material. In one non-limiting embodiment, the conductive portion of the lateral via is formed from a single conductive material (e.g., deposited by way of ALD). In another non-limiting embodiment, the lateral via further includes one or more insulative portions deposited by way of ALD. In yet another non-limiting embodiment, the conductive portion of the lateral via is formed from two or more conductive material (e.g., deposited by way of ALD and/or having any useful structure, such as alternating layers of two or more conductive materials that are deposited by way of ALD).

Figure 6B:
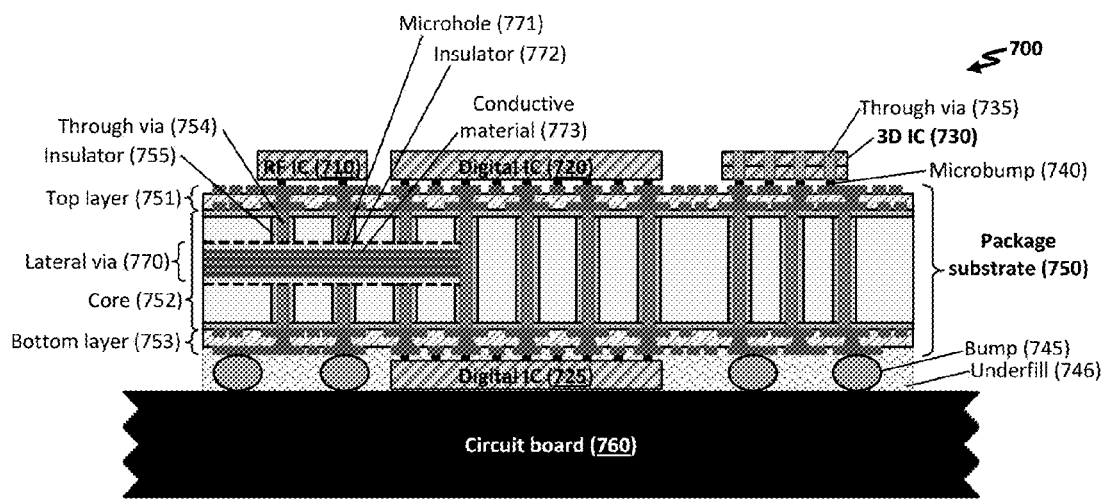

FIG. 6B provides a non-limiting embodiment of a stack 700 having one or more integrated circuit (IC) components 710,720,725,730 and a package substrate 750, which in turn are configured to be electrically connected to a circuit board 760. The lateral via 770 includes two or more conductive materials 773 deposited within a microhole 771 (e.g., by way of ALD) and having an optional insulator portion 772 (e.g., deposited by way of ALD). The 3D IC component 730 and/or the package substrate 750 can include one or more through vias 735,754 having optional insulator portions 755. The package substrate 750 can further includes a top layer 751, a core 752, and a bottom layer 753. Electrical connections between components can include use of microbumps 740 and/or bumps 745, which can optionally be coated with an underfill resin 746.

Figure 6C:
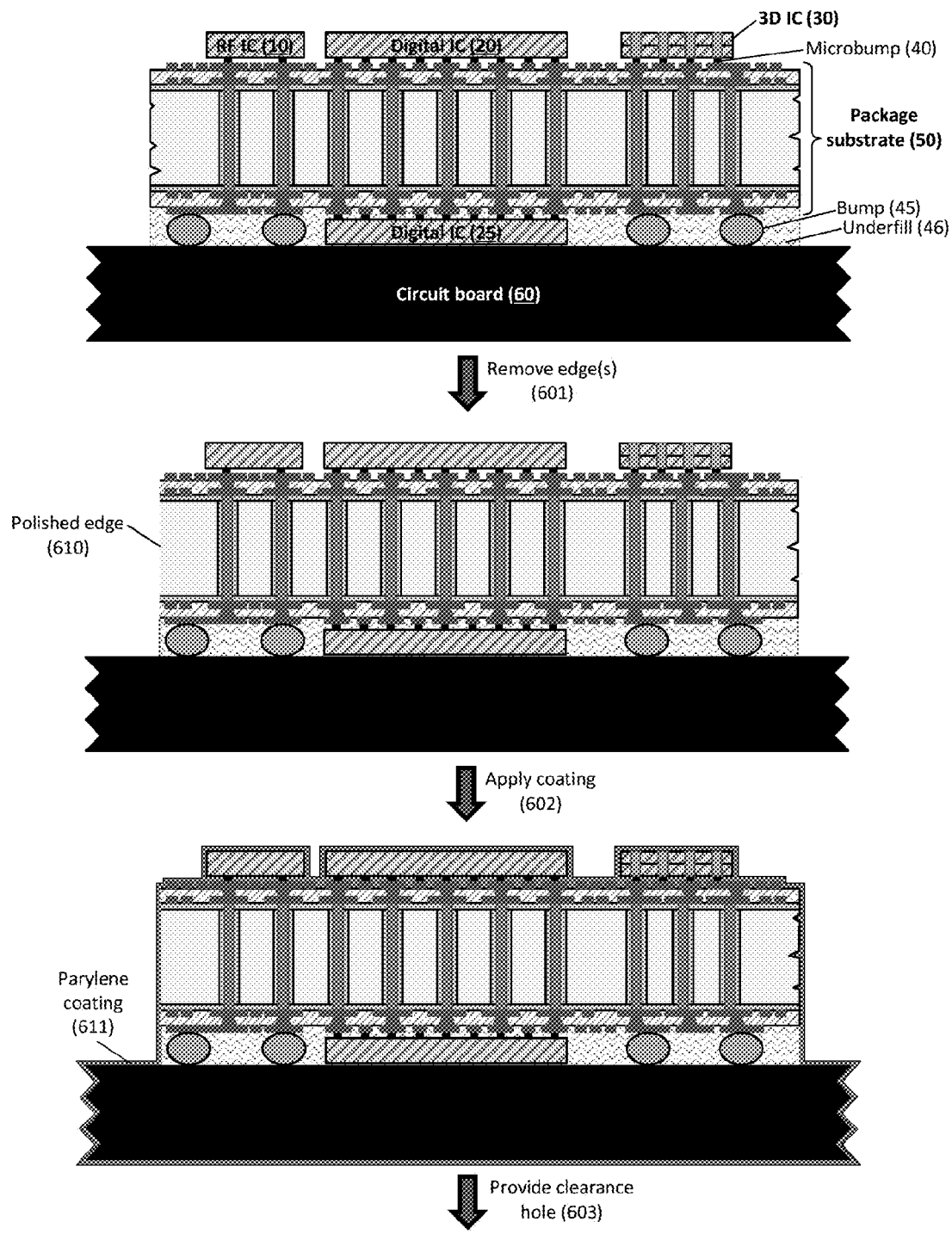
Figure 6D:
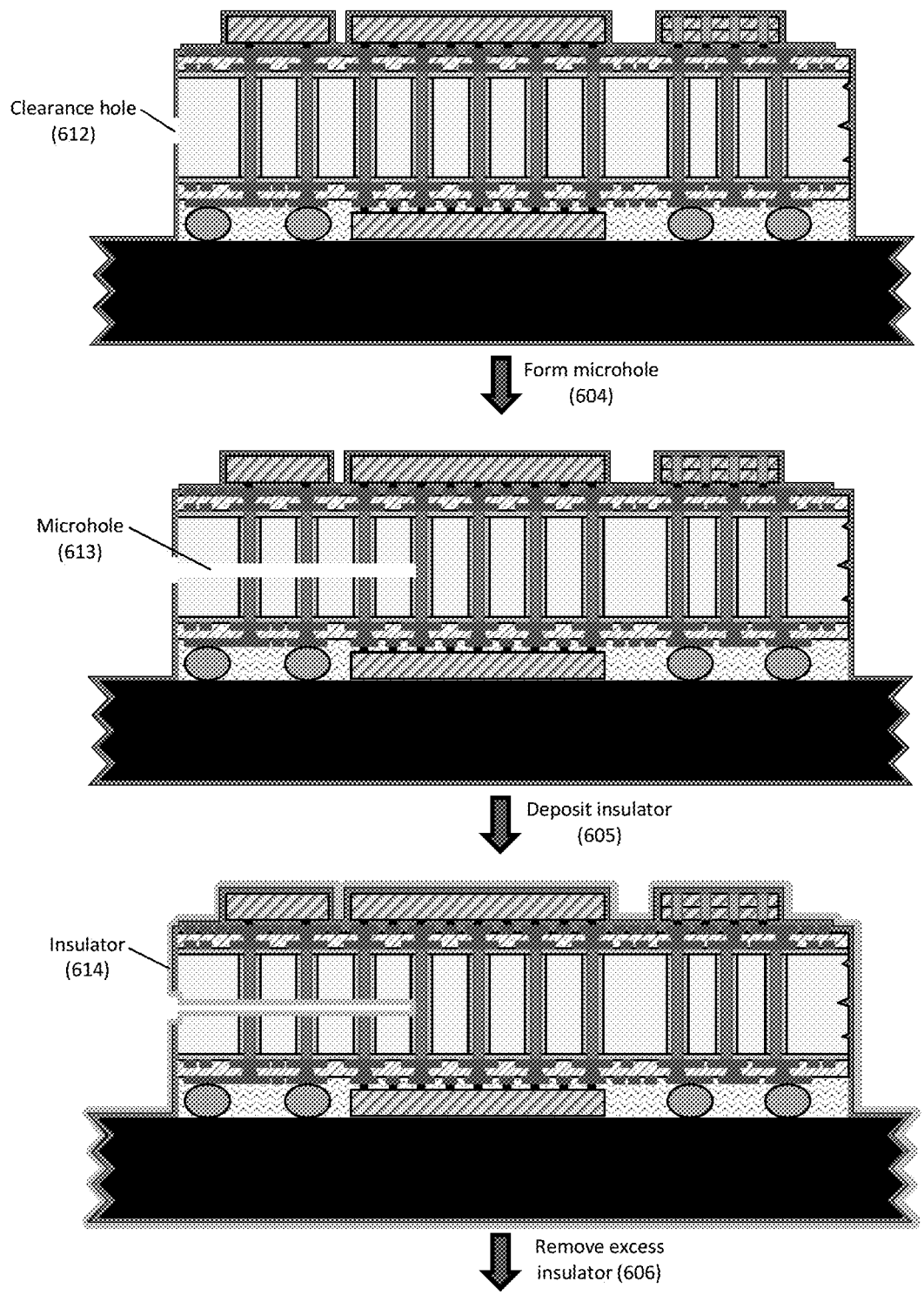
Figure 6E:
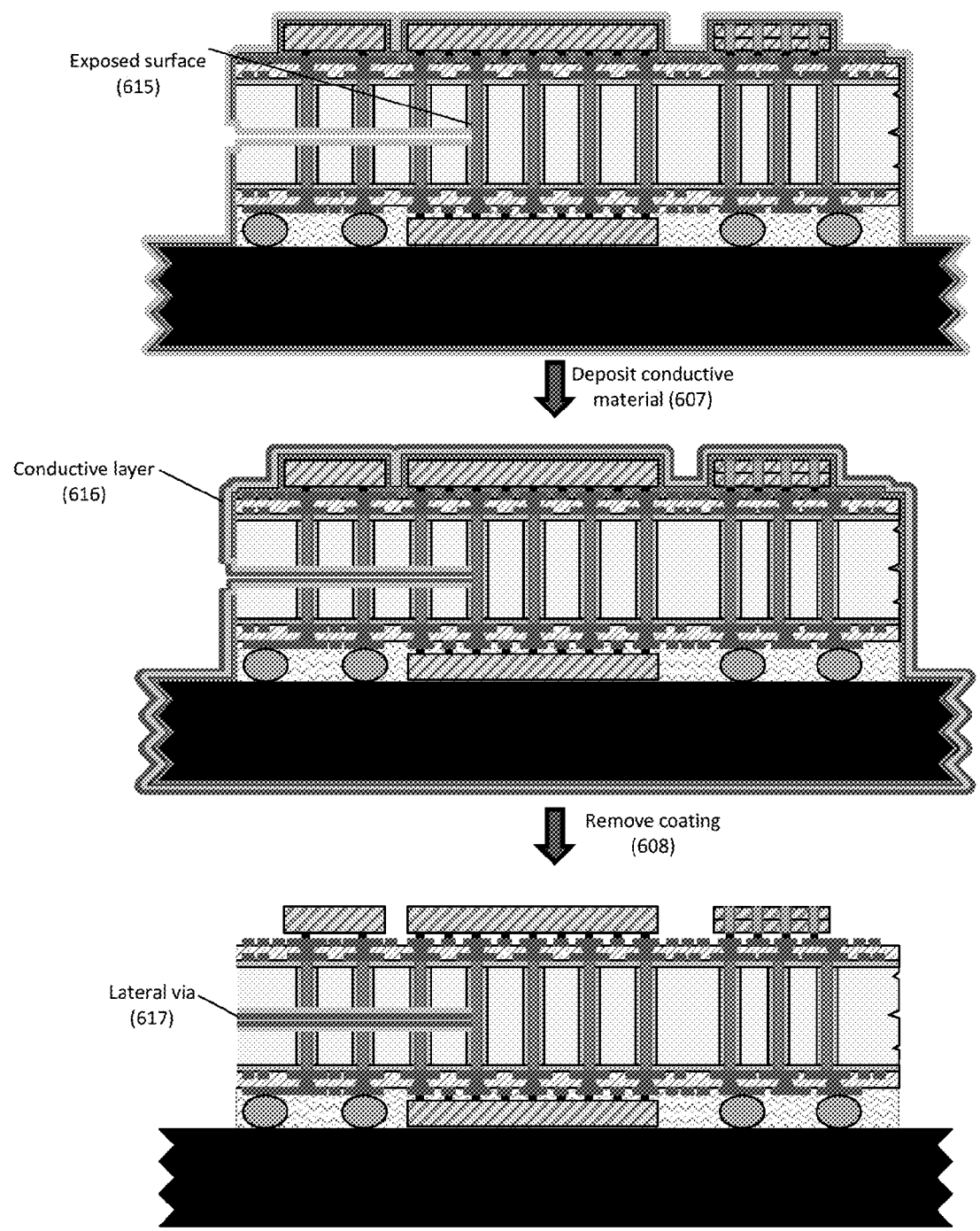

Stacks can be formed in any useful manner. As seen in FIG. 6C-6E, the method includes providing a stack, which includes one or more components 10,20,25,30; a package substrate 50; microbumps 40 configured to provide an electrical connection between a component 10,20,25,30 and the package substrate 50; a circuit board 60; and bumps 45 coated with an underfill 46 that are configured to provide an electrical connection between the package substrate 50 and the circuit board 60.

The exemplary method further includes removing 601 an edge of the stack to provide a smooth, planarized surface (e.g., a polished edge 610). Then, the method includes applying 602 a coating (e.g., a sacrificial layer), such as a conformal parylene coating 611 on an outer surface of the stack and/or component (or a portion of the outer surface of the stack and/or component); providing 603 a clearance hole 612; and forming 604 a microhole 613 within the stack. The clearance hole 612 can be initially formed to control placement and alignment of the microhole 613. The microhole 613 can be fabricated to have a length that allows for an electrical connection to one or more buried connectors.

Further additive steps can be conducted to deposit materials within the microhole. In one embodiment, the exemplary method includes depositing 605 one or more insulative materials within the microhole 613, as well as on an outside surface of the stack. One or more insulative materials may be deposited to form the insulator layer 614, and one or more layers including such insulative material(s) can also be deposited to form the insulator layer 614. An additive step can be followed by a subtractive step (e.g., an etching step) to remove 606 excess insulative material from a bottom surface of the microhole, thereby forming an exposed surface 615.

Next, the method can include depositing 607 a conductive material on a surface of the stack, including surface(s) provided by the microhole. As seen in FIG. 6C-6E, a conductive layer 616 is formed having one or more conductive material(s) and/or one or more layers deposited on and/or within the component. Finally, one or more sacrificial coatings can be removed 608, thereby releasing the stack having a lateral via 617 defined therein.

Apparatus The present invention also relates to an apparatus to fabricate a lateral via (e.g., any described herein) or to implement any method described herein. In one non-limiting instance, the apparatus includes a structure (e.g., a manifold) to deliver supplies for both subtractive and additive processes for establishing lateral via(s) configured to electrically connect to at least one buried, microscopic conductor.

The apparatus can include one or more structures to facilitate holding the sample (e.g., a component or a substrate), manipulating the sample, storing the sample, delivering one or more supplies to facilitate subtractive and/or additive processes, directing one or more laser light sources, and/or imaging the sample. In one non-limiting instance, the apparatus includes a sample holder, which can optionally function as a sample manipulator employed to position a sample in one of three orthogonal directions and/or one of two azimuthal rotations so to align to, register with, or otherwise gain access to a buried conductor. In yet another instance, the sample manipulator can be an etch-gas-resistant bellows manipulator that is configured for positioning.

The apparatus can optionally include an imaging system, which can be employed to locate a buried conductor for connection prior to or during hole fabrication. Furthermore, an imaging system can be used in conjunction with a sample manipulator to position a buried conductor with respect to the laser optic axis, such that a hole or channel can be fabricated without disturbing neighboring circuitry.

Figure 7:
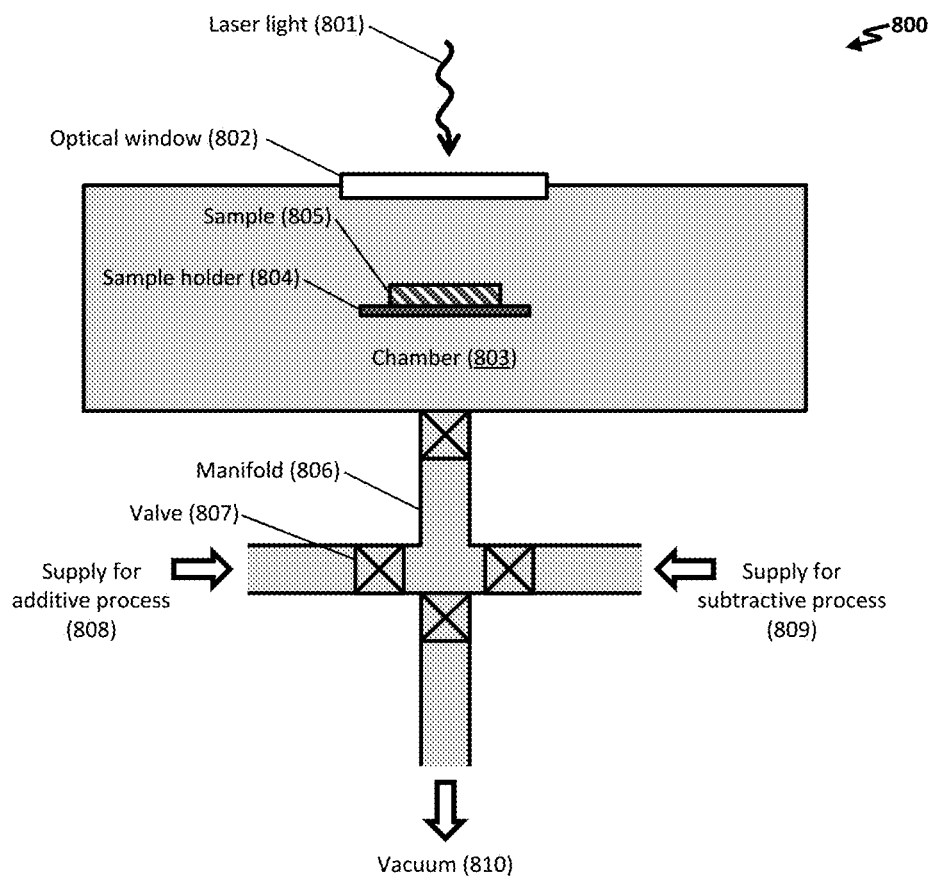
FIG. 7 shows a schematic of an exemplary apparatus 800 for creating a lateral via within a sample 805 (e.g., a component).

FIG. 7 provides an exemplary apparatus 800 configured to facilitate both subtractive and additive processes. As can be seen, the apparatus 800 includes a chamber 803 configured to contain the sample 805 (e.g., any component or stack described herein), as well as a manifold 806 to deliver various supplies 808,809. Such supplies can include a supply 808 for an additive process (e.g., a precursor that results in deposition of a conductive material or an insulative material, such as an ALD precursor gas) and a supply 809 for a subtractive process (e.g., an etchant, in liquid or gaseous form). The manifold can include one or more valves 807 to control the flow of these supplies and/or other sources, such as a vacuum source 810.

The chamber can include one or more heaters to promote sufficient heating at a particular temperature and/or a particular reaction area. Exemplary heaters can include heaters to control the temperature of the substrate and/or the sample holder, as well as heaters to regulate the chamber walls. Exemplary reactors and heaters are described in U.S. Pat. Nos. 6,939,579 and 7,112,544, each of which is incorporated herein by reference in its entirety.

The chamber can be configured to allow for sample manipulation, imagery, and treatment. For instance, the exemplary apparatus 800 can include a sample holder 804 configured to position the sample 805 (e.g., in relation to an ablative source, such as a laser light 801) within the chamber 803. In another instance, the exemplary apparatus 800 can include an optical window 802 that is transparent to an external ablative source, such as a laser producing laser light 801.

Materials

The lateral vias and components herein can be formed from any useful material. As described herein, one or more insulative materials can be used to provide an insulator portion. Exemplary insulative materials include an oxide insulator (e.g., aluminum oxide, titanium oxide, or silicon oxide), a nitride insulator (e.g., aluminum nitride), a polymer insulator (e.g., a polyimide), and combinations thereof (e.g., silicon oxynitride).

As also described herein, one or more conductive materials can be used to provide a conductive portion (e.g., a through via, a lateral via, a conductive layer, etc., as well as portions thereof). Exemplary conductive materials include a metal (e.g., platinum, silver, copper, tungsten, nickel, aluminum, gold, palladium, as well as alloys, combinations, mixtures, or composites thereof and doped versions thereof), a metalloid (e.g., silicon, including polycrystalline silicon), a polymer, a superconductor, a semiconductor, a ceramic, or a non-metallic conductor (e.g., graphite).

The component and/or stack can include one or more barrier layers (e.g., including titanium, titanium nitride, tantalum, and/or tantalum nitride); semiconductors (e.g., including silicon dioxide, silicon, a III-V material, glass, and/or an organic substrate); sacrificial coatings (e.g., a polymer, such as parylene); bumps and/or microbumps (e.g., including one or more solderable materials, such as copper, gold, nickel, zinc, chromium, vanadium, palladium, tin, lead, indium, silver, bismuth, as well as alloys and combinations thereof, such as tin/lead, tin/indium, tin/silver, or tin/bismuth); bond pads (e.g., including any useful conductive material, such as those described herein); and/or wires (e.g., including any useful conductive material, such as those described herein). In one non-limiting instance, the lateral via is accompanied by a laser contact pad on a neighboring surface for connection to additional circuitry. In a different implementation, the newly added metal may span a gap and connect two buried conductors.

Any of the materials can be formed in any useful manner, such as by employing an additive method to provide material(s) (e.g., deposition, casting, etc.) and/or a subtractive method to remove material(s) (e.g., etching, ablation, etc., to provide exposed surfaces, patterned surfaces, etc.).

EXAMPLES

Example 1: Method and Apparatus for Making Electrical Connections to Buried Microscopic Conductors The present invention relates to methods and apparatuses including electrical connections to buried microconductors. Microconductors, which are buried at the start, could be metal trace conductors in a circuit board, through silicon vias, metal lines in integrated circuit, or wires under a protective underfill (e.g., composed of epoxy or a composite). Microholes can be formed to provide access to the buried microconductor, and then new metallic connections can be formed. Such metallic connections (e.g., lateral vias) can involve one or more metals deposited into created holes, which can be optionally preceded by insulator deposition on a sidewall of the hole in order to isolate the newly added metal from a semiconductor substrate (e.g., a semiconductor core).

An exemplary method can include a combination of subtractive and additive processes in order to build an electrical connection (e.g., a lateral via) through a surrounding, inert material. For instance, subtractive processes can be employed to provide the microhole, and additive processes can be employed to deposit a conductive material within that microhole.

In one non-limiting embodiment, the method includes forming a hole or a channel that is opened to a buried conductor. The hole can be formed in any useful manner, such as by focused beam-stimulated material removal, ablation (e.g., laser ablation, including pulsed laser ablation), etching, laser machining, etc., as well as combinations thereof (e.g., chemically-assisted pulsed laser ablation, continuous wave laser-assisted chemical etching, and pulsed wave laser-assisted chemical etching). In one non-limiting instance, a hole or channel is aligned at an oblique angle with respect to the normal direction of the starting surface plane at the point of entry Subsequently, the fabricated hole or channel can be coated or filled with a conductive material (e.g., a metal or a metal precursor). A conductive material can be provided in any useful manner, such as deposition (e.g., atomic layer deposition) with optional assistance or stimulation by way of laser irradiation (e.g., local heating of the site for the intended microhole). Prior to any additive and/or subtractive process, a surface of the component can be protected, e.g., by way of a conformal layer or a sacrificial layer, such as a parylene coating.

The deposited conductive material can be configured to ensure contact with the buried electrical conductor, as well as extended to a free surface to ensure access for connection to external circuitry. In one instance, the lateral via can include a distal end located towards the center of the component and a proximal end located towards an edge of the component. As seen in FIG. 1C, the lateral via 171 has a distal end 171A located towards the center of the component 170, thereby forming a contact region with a first through via 174A. The lateral via 171 also has a proximal end 171B located towards an edge of the component 170, thereby allowing for a connection to external circuity (e.g., by way of one or more wires and/or bond pads). In one non-limiting instance, the proximal end of a lateral via is configured to form an electrical connection to a metal line on a circuit board.

Optionally, the method can further include the step of placing an insulator portion prior to deposition of the conductive material. The insulator portion can be placed around the fabricated hole or channel, or a portion thereof. In this way, the deposited conductive material is electrically isolated from the surrounding substrate or core.

The method can be implemented by using a single apparatus for all processes, e.g., subtractive and additive processes. In one instance, a vacuum-based apparatus of system can be used to provide sample positioning and alignment, so as to access certain buried conductors. High-aspect ratio holes can be defined at normal or off-normal angles of incidence with respect to the substrate plane of entry. Such capability can enable, e.g., connection to buried, microscopic conductors that lie below rows of other conductors.

The deposited conductive material can include a distal end that is configured to contact a buried electrical conductor, as well as include a proximal end that extends back to a free surface for connection to external circuitry. Alternatively, the deposited conductive material may be used for circuit repair by connecting two or more buried metal conductors or by closing an open failure within a single, buried conductor. An insulator portion (e.g., an isolating liner) may first be placed around the fabricated hole or channel prior to deposition of the conductive material.

Example 2: Details Regarding Subtractive and Additive Processes

Any useful subtractive and additive processes can be employed to fabricate a lateral via. In one non-limiting instance, a subtractive technique includes laser ablation (continuous or pulsed), laser-induced chemical etching, and/or chemical-assisted laser ablation. Imaging before and during material removal could assist the location and subsequent connection to the conductor. Both normal incidence or non-normal incidence subtraction, with respect to the plane of a board or substrate, are envisioned. A non-normal approach process could provide access to buried rows of conductors that are positioned under a first row or column. Imaging can be employed (e.g., before, during, or after the subtractive process, as well as during breaks in the process) to gain access to the desired buried conductor.

In one instance, laser ablation can be used to make microholes or channels to gain access to buried conductors. Lasers can be continuous wave (CW) or pulsed with the latter being useful for minimizing heat-affected zones. Various techniques such as laser-induced breakdown spectroscopy can be used for end pointing. Holes may be created by single point irradiation or laser scanning over larger areas. A grouping of holes is also feasible.

Continual change to the stage height (or focal depth) may be employed to maintain focus on the exposed, newly-created surface of the as-machined microhole. For soft (e.g., non-affecting) arrival on a buried conductor, one or more of several strategies may be useful. This can include ablating the surrounding inert material using a fluence or wavelength that does not impact the conductor. For example, the wavelength may couple to the surrounding material but reflect strongly from the metal conductor. Any useful laser drilling methods can be employed, e.g., such as those in U.S. Pat. Nos. 4,948,941 and 6,657,159, each of which is incorporated herein by reference in its entirety.

Laser etching of a silicon or a III-V substrate could also provide access to buried conductors (see, e.g., FIG. 6C-6E). The package substrate can include buried conductors (e.g., a through silica via or TSV), in which material can be removed to access these buried connectors. The exemplary method can include polishing an edge of the package substrate, and then applying a coating with a sacrificial layer (e.g., parylene). Then, a clearance hole can be defined in the sacrificial layer by laser ablation. The substrate can be aligned to target the desired TSV, and pulsed laser etching can be used to create a microhole to access the buried conductor.

Any useful additive processes can be employed. In one non-limiting instance, the additive process is atomic layer deposition (ALD). Laser-stimulated ALD could be completed in the same chamber used for etching. Any useful deposition methods can be employed, such as those in U.S. Pat. No. 6,903,013, which is incorporated herein by reference in its entirety.

Various materials can be deposited by ALD, including insulative and conductive materials. ALD can be used to deposit one or more conductive materials (e.g., one or more metals). In another instance, holes can be filled once a seed layer of metal is established.

In one instance, a sacrificial layer (e.g., a parylene layer) can also be attached through additive processes. This could be completed after a hole is made or after an area/volume is cleared. In another instance, the sacrificial layer can be deposited prior to insertion in the chamber. Afterwards, laser ablation at high pulse power could ablate parylene. Then, the silicon or semiconductor core can be etched using a laser-stimulated process. For a silicon substrate, any useful etchant (e.g., molecular chlorine) could be used. The chamber can then be evacuated, and ALD can be used to deposit the insulative and/or conductive material(s).

FIG. 6C-6E shows various additive processes employed with the stack. An insulative material can be deposited 605 on the side wall, as well as on the sacrificial layer (e.g., on the parylene). One or more conductive materials can be deposited 607 within the hole (e.g., either entirely or partially within the hole), thereby facilitating an electrical connection to made to the buried connector. Finally, the sacrificial parylene coating can be removed 608, thereby providing the stack with a lateral via. Optionally, one or more additional metal deposition steps can be conducted to provide wire bonding or an electrical connection from the lateral via to an external circuitry.

In another instance, ALD can be employed to first deposit one or more insulative materials, followed a step to deposit one or more conductive materials. Optionally, an intermediate step can be conducted to remove a portion of deposited insulative material (e.g., by way of laser removal) at the end or back of a hole to regain access to the buried metal conductor. In one non-limiting instance, starved ALD is employed to coat only a limited length of the defined microhole.

In another non-limiting instance, the same laser used for etch or ablation can be reduced in average power to heat the inside of an etched or ablated hole. Alternatively, the surrounding surface about the hole could be laser heated. This could be implemented to stimulated site-selective ALD, while minimizing damage or melting of the substrate.

A single apparatus can be employed for enabling subtractive removal and additive deposition (e.g., see non-limiting apparatus 800 in FIG. 7). A laser etch system that is capable of removing material (e.g., Si) by chemical laser methods can be adapted to include ALD chemistries (e.g., ALD of precursors for insulative and/or conductive materials). Within this apparatus, the sample can be imaged and positioned to enable the fabrication of metal connections to targeted, buried conductors. Positioning may involve movement in x, y, and/or z directions, as well as other rotational movements. A corrosion-resistant bellows manipulator can be used for rotation in a corrosive environment.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A component comprising:
    a buried conductor disposed within the component, wherein the buried conductor is electrically inaccessible from an outer surface of the component and wherein the buried conductor has a first longitudinal dimension extending along a length of the buried conductor;
    a lateral via disposed within the component and configured to electrically connect to the buried conductor, wherein the lateral via has a second longitudinal dimension extending along a length of the lateral via and wherein the second longitudinal dimension is generally orthogonal or oblique to the first longitudinal dimension; and
    a first insulator portion disposed on a proximal portion of the lateral via, wherein the first insulator portion is configured to electrically isolate the lateral via.

2. The component of claim 1, wherein the buried conductor comprises a through via or a solder bump.

3. The component of claim 1, wherein the component comprises a plurality of lateral vias, and wherein at least two of the plurality of lateral vias are configured to be electrically interconnected.

4. The component of claim 1, further comprising:
    an underfill resin configured to surround the buried conductor,
    wherein the buried conductor is disposed within the underfill resin; and
    wherein the lateral via is disposed within the underfill resin and configured to electrically connect to the buried conductor.

5. The component of claim 1, further comprising:
    a core comprising a top surface and a bottom surface,
    wherein the buried conductor is disposed within the core and extends between the top and bottom surfaces; and
    wherein the lateral via is disposed within the core and configured to electrically connect to the buried conductor.

6. The component of claim 1, wherein the lateral via comprises:
    a conductive material comprising a contact region and an extended region, wherein the contact region is configured to electrically connect to the buried conductor and wherein the extended region is configured to extend into a portion of the component; and
    an insulator configured to contact the extended region, or a portion thereof.

7. The component of claim 6, wherein the conductive material comprises a plurality of first and second layers, wherein a first layer comprises a first metal, and wherein a second layer comprises a second metal.

8. The component of claim 7, further comprising:
    an encapsulant disposed on an outer surface of the component, wherein the lateral via is configured to be electrically accessible.

9. The component of claim 1, further comprising:
    a bottom layer extending along the bottom surface of the component, wherein the bottom layer comprises one or more conductive layers and one or more devices, and wherein the buried conductor is configured to electrically connect to at least one of the conductive layers; and an insulator portion disposed between the bottom layer and the bottom surface of the component, wherein the buried conductor extends through the insulator portion in order to be electrically accessible.

10. A stack comprising:
a component of claim 1;
a first die configured to be electrically connected to a first portion of the component; and
a second die configured to be electrically connected to a second portion of the component.

11. A component comprising:
a plurality of buried conductors disposed within the component, wherein each of the buried conductors is electrically inaccessible from an outer surface of the component and wherein each of the buried conductors has a first longitudinal dimension extending along a length of the buried conductor;
a plurality of lateral vias disposed within the component, wherein each lateral via is configured to electrically connect to at least one of the plurality of buried conductors, wherein each of the lateral vias has a second longitudinal dimension extending along a length of the lateral via and wherein the second longitudinal dimension is generally orthogonal or oblique to the first longitudinal dimension; and
a first insulator portion disposed on a proximal portion of each of the lateral vias, wherein the first insulator portion is configured to electrically isolate each of the lateral vias.

12. The component of claim 11, wherein each of the plurality of buried conductors comprises a through via.

13. A component comprising:
a core comprising a top surface and a bottom surface;
a buried conductor disposed within the core, wherein the buried conductor extends between the top and bottom surfaces, wherein the buried conductor is electrically inaccessible from an outer surface of the component, and wherein the buried conductor has a first longitudinal dimension extending along a length of the buried conductor;
a lateral via disposed within the core and configured to electrically connect to the buried conductor, wherein the lateral via has a second longitudinal dimension extending along a length of the lateral via and wherein the second longitudinal dimension is generally orthogonal or oblique to the first longitudinal dimension;
a first insulator portion disposed on a proximal portion of the lateral via, wherein the first insulator portion is configured to electrically isolate the lateral via;
a second insulator portion configured to electrically isolate the buried conductor;
a top layer extending along the top surface of the core; and
a bottom layer extending along the bottom surface of the core.

14. The component of claim 13, wherein the buried conductor comprises a through via.

15. The component of claim 13, wherein the lateral via comprises:
a conductive material comprising a contact region and an extended region, wherein the contact region is configured to electrically connect to the buried conductor and wherein the extended region is configured to extend into a portion of the core; and
an insulator configured to contact the extended region, or a portion thereof.

16. The component of claim 13, wherein the top layer comprises one or more conductive layers and the buried conductor is configured to electrically connect to at least one of the conductive layers in the top layer; and wherein the bottom layer comprises one or more conductive layers and the buried conductor is configured to electrically connect to at least one of the conductive layers in the bottom layer.

17. The component of claim 16, wherein the one or more conductive layers in the bottom layer comprises one or more metal interconnects, interlayer vias, trace conductors, or metal lines.

18. The component of claim 16, wherein the bottom layer further comprises one or more devices, and wherein the buried conductor is configured to electrically connect to at least one of the devices in the bottom layer.

* * * * *